(12) United States Patent
Tilbrook

(10) Patent No.: US 7,508,202 B2
(45) Date of Patent: Mar. 24, 2009

(54) METHOD AND APPARATUS FOR MAGNETIC FIELD DETECTION

(75) Inventor: David Louis Tilbrook, Glenorie (AU)

(73) Assignee: Commonwealth Scientific and Industrial Research Organisation, Campbell (AU)

( * ) Notice: Subject to any disclaimer, the term of this patent is extended or adjusted under 35 U.S.C. 154(b) by 196 days.

(21) Appl. No.: 10/523,958

(22) PCT Filed: Aug. 7, 2003

(86) PCT No.: PCT/AU03/00999

§ 371 (c)(1),
(2), (4) Date: Nov. 17, 2005

(87) PCT Pub. No.: WO2004/015435

PCT Pub. Date: Feb. 19, 2004

(65) Prior Publication Data

US 2006/0186881 A1   Aug. 24, 2006

(30) Foreign Application Priority Data

Aug. 7, 2002   (AU) ............................... 2002950624

(51) Int. Cl.
*G01R 33/035* (2006.01)
(52) U.S. Cl. ...................... 324/248; 505/846
(58) Field of Classification Search ............... 324/244, 324/248, 260; 505/162, 845–846; 600/409; 326/5; 327/527–528; 336/DIG. 1
See application file for complete search history.

(56) References Cited

U.S. PATENT DOCUMENTS

| 4,489,274 | A | * | 12/1984 | Berlincourt | .................. 324/248 |
| 4,492,923 | A | | 1/1985 | Byram | |
| 5,357,802 | A | | 10/1994 | Hofmeyer et al. | |
| 5,469,056 | A | | 11/1995 | Eschner et al. | |

FOREIGN PATENT DOCUMENTS

GB   2258314   2/1993

OTHER PUBLICATIONS

International Search Report for PCT/AU03/000999 (Aug. 9, 2003).
David Gleason, Air Force Research Laboratory, Space Vehicle Directorate, Hanscom AFB, MA, presentation at Darpa Pins Meeting, May 27, 2003, "Critical Role of Gravity Compensation in a Stand-Alone Precision INS".

* cited by examiner

*Primary Examiner*—Bot LeDynh
(74) *Attorney, Agent, or Firm*—Kenyon & Kenyon LLP

(57) ABSTRACT

A method and device for field detection are provided, in which one or more gradiometers (31, 32, 33) are positioned in the field and rotated about their axes. Rotation of a single gradiometer allows an output signal of the gradiometer to be analyzed in the Fourier domain, which allows particular field components to be obtained, and also separates the field signal from noise, in the frequency domain. Use of three such rotating gradiometers with non-parallel axes allows a complete magnetic field gradient tensor to be obtained with data redundancy, and can reduce crosstalk.

19 Claims, 1 Drawing Sheet

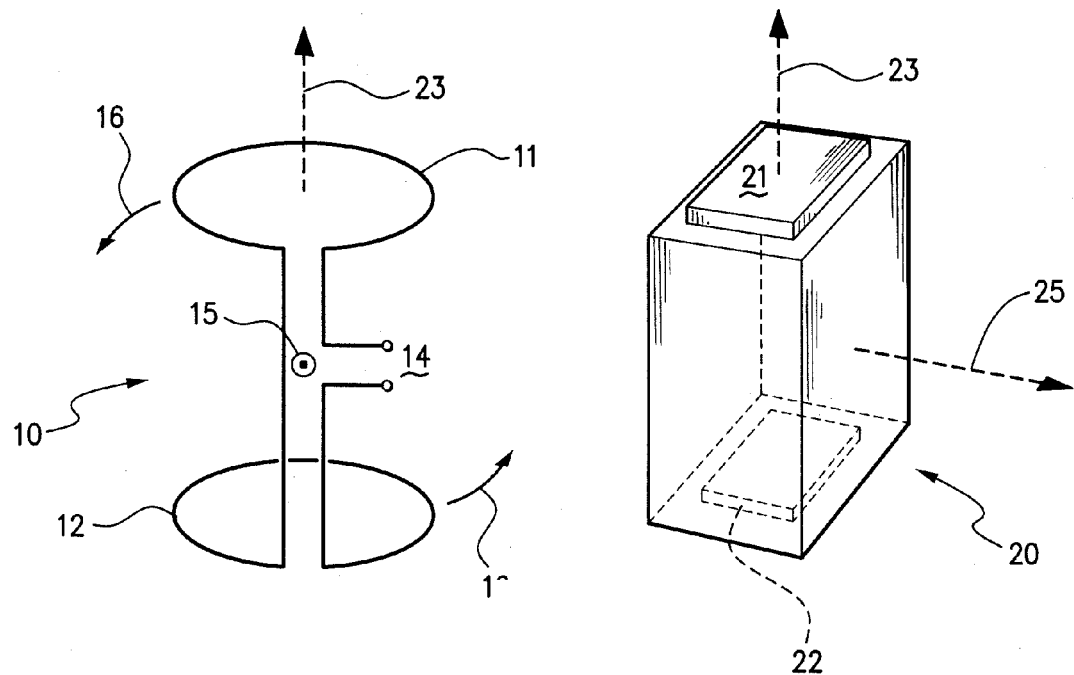
FIG. 1A  FIG. 1B
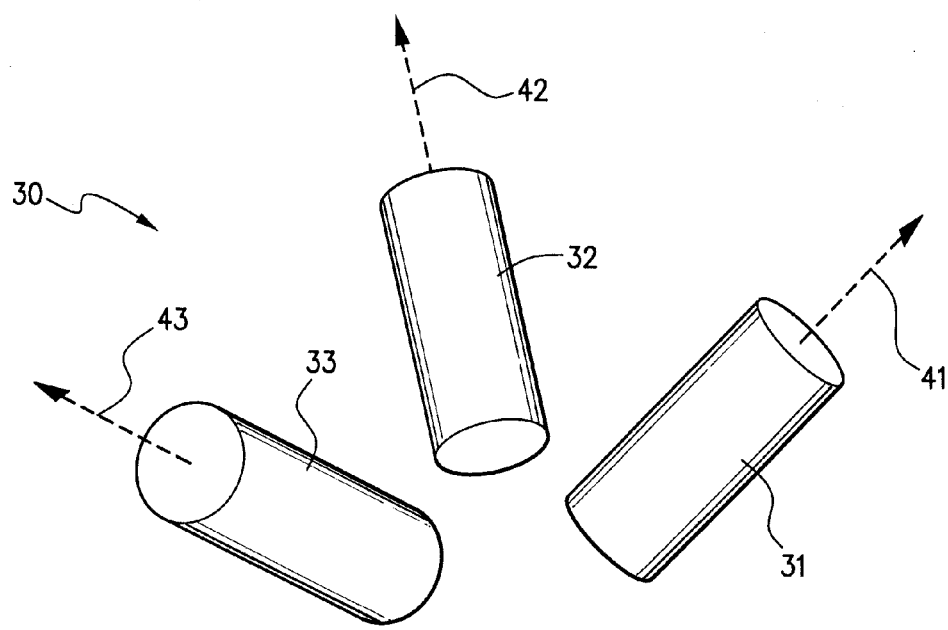
FIG. 2

METHOD AND APPARATUS FOR MAGNETIC FIELD DETECTION

CROSS-REFERENCE TO RELATED APPLICATIONS

This application is a 35 U.S.C. 371 national stage of International Application No. PCT/AU2003/000999 filed Aug. 7, 2003, which claims priority to Australian Application No. AU 2002950624 filed Aug. 7, 2002.

TECHNICAL FIELD

The present invention relates to a method and apparatus for measurement of a magnetic field, and in particular relates to rotating a magnetic sensor relative to the magnetic field to be measured.

BACKGROUND ART

A gradiometer is a device for measuring the difference between two signals, with an aim to facilitate rejection of common mode noise signals and improved reduction in errors that arise from misorientation of the measuring instrument.

The ability of a gradiometer to measure small magnetic field gradients in the presence of a large background magnetic field is determined by its ability to reject large common mode signals, and the intrinsic noise and drift performance of the field detectors employed. The first of these characteristics is called the common mode rejection ratio (CMRR). In conventional gradiometers the CMRR is determined by the precision with which the field sensors comprising the gradiometer are balanced. That is, the CMRR is determined by the relative sensitivities of the field sensors, and the accuracy to which the field sensors can be positioned in precisely parallel planes. This fundamental nexus between the precision with which conventional gradiometers can be manufactured and the ultimate CMRR performance has until now limited the CMRR to figures of the order of $10^{-4}$ in practical instruments.

Further, the DC and low frequency accuracy of state of the art gradiometers is limited by the DC and drift performance of the field detectors employed, and is also limited by the low frequency noise performance of the field detectors. Furthermore, the achievable noise performance can be dependent upon the magnitude of the background homogeneous field; being determined by microphonics which arise from vibrations causing randomly varying misalignment of the axes of symmetry of the two field sensors. For example, in the case of magnetic gradiometry two appropriate magnetic sensors are the flux gate and the superconducting quantum interference device (SQUID). Flux gates have considerable drift and noise in comparison to SQUIDs, but state of the art SQUID systems are incapable of providing data about the absolute value of the magnetic field or gradient.

The inability of state of the art SQUIDs to measure the absolute value of the magnetic field or gradient arises for the following reasons. The radio frequency (rf) SQUID is essentially a ring of superconducting material, the ring being interrupted by a Josephson Junction. When the superconducting ring is energised by an inductively coupled resonant rf-oscillator, tunnelling of electrons takes place at the junction and a periodic signal, being a function of flux through the ring, can be detected across the junction. The periodic signal is substantially a triangular waveform, usually having a period (ΔB) in the order of a nanotesla. Therefore, in order to yield a sensitivity in the femtotesla range, the SQUID is operated in a nulling bridge mode, or flux locked loop (FLL) mode. In this mode, magnetic flux is fed back to the SQUID so as to cause the output voltage to remain relatively constant. The feedback voltage, being proportional to the difference between the applied flux and the quiescent flux level, gives a highly accurate measurement of relative magnetic flux. The feedback voltage V can therefore be written as $$V = M(A_{eff}B + u) \qquad (1)$$

where
M is a constant in a specific SQUID system;
$A_{eff}$ is the effective area of the SQUID;
B is the applied magnetic field; and
u is the quiescent flux.

However, the quiescent flux u is unknown. Thus, conventional rf-SQUIDs provide only relative measurements of magnetic field, up to an offset (which can usually be held constant for the duration of the measurement procedure) which is an integer multiple of a field value determined by the sensitivity of the SQUID and the fundamental flux quantum. The SQUID, therefore, is not an absolute field detector and state of the art gradiometers cannot provide absolute value measurements of the gradient components.

A further problem arises in tensor gradiometers. The gradient of a field in 3 dimensions is a second rank tensor, and accordingly has 9 components. In the case of magnetic fields Maxwell's equations impose restrictions which imply that only 5 of the gradient components are independent. To determine the gradient tensor of a magnetic field it is therefore necessary to measure all 5 of these components. State of the art tensor gradiometers achieve this by deploying a suite of at least 5 field sensors or planar gradiometers, or a combination of field sensors and planar gradiometers.

However, a problem which arises from the use of a plurality of field sensors or gradiometers to measure the gradient components, is that the sensors or gradiometers distort the field in their neighbourhood. Consequently, each sensor or gradiometer adversely affects the measurement of the field by the other sensors or gradiometers which are deployed to measure other gradient components. Such a "cross-talk" effect limits the accuracy of the gradient measurement.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

Throughout this specification, the terms 'superconducting material', 'superconducting device' and the like are used to refer to a material or device which, in a certain state and at a certain temperature, is capable of exhibiting superconductivity. The use of such terms does not imply that the material or device exhibits superconductivity in all states or at all temperatures.

SUMMARY OF THE INVENTION

According to a first aspect, the present invention provides a method of field detection comprising:

providing a gradiometer in a field, the gradiometer having at least first and second field vector sensors connected in a differencing arrangement; and controllably altering a position of the at least first and second field vector sensors relative to the field during operation of the gradiometer.

According to a second aspect the present invention provides a field detection device comprising:

a gradiometer, the gradiometer having at least first and second field vector sensors connected in a differencing arrangement; and means for controllably altering the position of the at least first and second field vector sensors relative to a field during operation of the gradiometer.

In preferred embodiments of the present invention, the at least first and second field vector sensors of the gradiometer are substantially axially aligned, thus forming an axial gradiometer. That is, the at least first and second field vector sensors are preferably positioned relative to each other such that first and second field vectors sensed by the respective first and second field vector sensors are substantially co-axial. However, the present invention may also be applied in respect of other devices such as planar gradiometers.

In particularly preferred embodiments of the present invention, the position of the at least first and second field vector sensors is controllably altered by rotating the at least first and second field vectors about an axis of rotation. Such rotation may be continuous, as in the case of a motor driving the gradiometer at a substantially constant revolutional velocity about the axis of rotation. Alternatively, the rotation may be piecewise about the axis of rotation, as in the case of manual rotation of the gradiometer through a given angle about the axis of rotation. Measurements may be obtained from the gradiometer before, during, and/or after such a manual rotation.

In preferred embodiments of the invention, the axis of rotation is positioned substantially perpendicular to the co-axial first and second field vectors. The axis of rotation preferably passes substantially between the first and second field vector sensors, and substantially equidistant from the first and second field vector sensors.

In accordance with preferred embodiments of the present invention, the gradiometer is made to rotate so that the direction of the sensitive direction of the field vector sensors or their sensitivities is changed in a known way.

In accordance with preferred embodiments of the invention, the gradiometer may be an axial magnetic gradiometer, and may be formed from a pair of SQUIDs, flux gates or superconducting pick-up loops with their sensitivity vectors lying substantially in a nominal x-y plane. In preferred embodiments, such an axial gradiometer is rotated about a nominal z-axis to form the rotating gradiometer.

While the use of an axial gradiometer may be favoured in implementations of the present invention because of its intrinsic noise immunity, the advantages of rotating a gradiometer are not limited to the axial configuration.

It has been realised by the present inventors that a rotating axial magnetic gradiometer returns information about the value of the $g_{xy}$ component and linear combinations of the values of the $g_{xx}$ and $g_{yy}$ components of a field gradient tensor, in addition to information about the $B_x$ and $B_y$ field components. In preferred embodiments of the invention, such information is retrieved by transforming the voltage waveform from the field vector sensors into the Fourier domain.

Furthermore, it has been realised that it is possible to obtain the complete magnetic gradient tensor by deploying three such rotating gradiometers, configured in such a way that their respective axes of rotation are not parallel.

Accordingly, in a third aspect, the present invention provides a method of obtaining a complete magnetic gradient tensor of a magnetic field, the method comprising:

providing at least three axial gradiometers in the magnetic field such that an axis of each axial gradiometer is not parallel to an axis of any other one of the at least three gradiometers; and controllably altering a position of each of the at least three gradiometers relative to the magnetic field during operation of the gradiometer.

Preferably the step of controllably altering comprises rotating each of the at least three axial gradiometers about a respective axis of rotation of that gradiometer. The axis of rotation of each gradiometer is preferably not parallel to an axis of rotation of any other one of the at least three gradiometers.

Similarly, in a fourth aspect, the present invention provides a device for obtaining a complete magnetic gradient tensor of a magnetic field, the device comprising:

at least three axial gradiometers positioned such that an axis of each axial gradiometer is not parallel to an axis of any other one of the at least three gradiometers;

means for controllably altering a position of each of the at least three gradiometers relative to the magnetic field during operation of the gradiometer.

Preferably the means for controllably altering comprises means for rotating each of the at least three axial gradiometers about a respective axis of rotation of that gradiometer. The axis of rotation of each gradiometer is preferably not parallel to an axis of rotation of any other one of the at least three gradiometers.

In preferred embodiments of the third and fourth aspects of the invention, the at least three gradiometers are rotated at a substantially constant velocity about their respective axes of rotation. Such embodiments produce data suitable for conversion to the Fourier domain.

Embodiments of the third and fourth aspects of the invention effectively provide a single measurement of the true value of each of the three off-diagonal components of the gradient tensor, three measurements of the diagonal components and two measurements of each of the field components. Because more than the minimum of five tensor components are obtained, the use of just three such rotating gradiometers in fact provides a redundant measurement. This redundancy permits a least-squares best fit solution, further improving the quality of data obtained. Any DC offsets such as low frequency drift in flux gates or the fixed offset of a SQUID, for example, can also be determined and monitored to provide information about the operating conditions of the detectors. Such offsets can also be separated from gradient data in the Fourier domain.

In preferred embodiments of the third and fourth aspects of the invention, data obtained is converted to the Fourier domain. In the Fourier domain the gradient information is distinguishable from the field information because the signals due to the gradient fields are centred at twice the rotation frequency while those due to the fields are centred at the rotation frequency.

Further, information about the $g_{xy}$ component of the gradient tensor may be distinguished from that due the diagonal gradient components, even at the same frequency, because one involves taking the Fourier transform of a cosine waveform, which is real and even, while the other involves the Fourier transform of a sine wave, which is odd and imaginary. The Fourier transformation may be implemented by means of a conventional fast Fourier transform algorithm or even simple discrete implementation via a coarse sampling of say 8 data points per cycle of the rotation.

To first-order any mismatches in the sensitivities of the field sensors or their relative alignment gives rise to contributions only at the fundamental frequency (discussed in more detail in the following) and therefore such mismatches do not determine the ultimate CMRR of the gradiometer. The final CMRR performance is determined by the resolution and precision of the data handling and the ultimate noise floor of the detectors. Accordingly, preferred embodiments of the present invention may provide for a CMRR improved by several orders of magnitude over that of state of the art instruments.

Further, since the external gradient and field are modulated by the rotation, but DC offsets, drift or very low frequency noise in the detectors are not, the rotation provided by the present invention facilitates separation of the these effects in the Fourier domain so that the DC and low frequency performance of the instrument is not limited by the performance of the detectors in these respects.

Furthermore, in the case of magnetic gradiometry, if the gradiometer is to be employed in a moving platform such as an aircraft, for example, a suspension system is generally used to isolate the instrument from vibrations which would otherwise induce significant noise by moving the instrument in the earth's magnetic field. However, in previous systems, such suspension systems have proven to be extremely difficult to engineer as significant isolation is required at sub 1 Hz frequencies. However, the rotating gradiometer provided by present invention modulates low frequency signals with the rotation frequency, thus facilitating the use of suspension systems which then only need to provide effective vibration isolation near the fundamental and first overtone of the rotation frequency. Such suspension systems are typically significantly easier to engineer than sub-1 Hz suspension systems.

In preferred embodiments of the third and fourth aspects of the invention, the at least three gradiometers are rotated at differing frequencies. Such embodiments of the invention facilitate separation of the frequency of operation of each gradiometer, and further facilitate a reduction in "cross-talk" between the respective gradiometers, of the type set out in the preceding discussion. As such cross-talk effects will be occurring at differing frequencies, the effect of one gradiometer operation on another can be filtered out or removed in the frequency domain.

Accordingly, preferred embodiments of the present invention may yield significant advantages over previous field detection devices and methods in a number of ways. First, rotation of the gradiometer breaks the nexus between engineering tolerances (in positioning two sensors in precisely parallel planes) and the ultimate CMRR performance. Further, providing three rotating gradiometers in accordance with embodiments of the third and fourth aspects of the present invention yields measurements of all five components of the gradient tensor and all three the components of the field, with redundancy in the data, all by using only 3 field detectors. Additionally, the rotation of the gradiometer breaks the dependence of the DC performance of the instrument on the DC performance of the detectors. Embodiments of the present invention also facilitate absolute value measurements of both the gradient and field components using SQUIDs. Embodiments of the present invention may also provide real time information of the condition of the SQUID in operation, for example as to whether or not the SQUID has remained in lock. As noted in the preceding discussions, previous SQUID devices have only been capable of making relative field measurements, not absolute field measurements. Furthermore, embodiments of the present invention may improve the sensitivity of field detection by shifting the working point of the detectors to a higher frequency, where the noise performance of the detectors and the vibration isolation afforded by suspension systems is superior. Yet further, certain embodiments of the present invention can serve to reduce the effects of cross-talk by use of distinguishable rotation frequencies.

BRIEF DESCRIPTION OF THE DRAWINGS

By way of example only, preferred embodiments of the invention will be described with reference to the accompanying drawings, in which:

FIG. 1a illustrates a low temperature superconducting gradiometer in accordance with the present invention;

FIG. 1b illustrates a high temperature superconducting gradiometer in accordance with the present invention; and FIG. 2 illustrates a three-gradiometer magnetic field detection device in accordance with the present invention.

DESCRIPTION OF THE INVENTION

FIG. 1a illustrates a low temperature superconducting gradiometer 10 in accordance with the present invention. Gradiometer 10 comprises a first field vector sensor in the form of superconducting wire loop 11. Gradiometer 10 further comprises a second field vector sensor in the form of superconducting wire loop 12. Sensors 11 and 12 are positioned substantially coaxially so as to sense field vectors along axis 13. Further, sensors 11 and 12 are connected in a differencing arrangement, whereby a signal produced at terminals 14 stems from the difference between the magnetic field vectors sensed by sensors 11 and 12. In accordance with the present invention, gradiometer 10 is configured to rotate about axis 15, which is at a normal to the page as viewed in FIG. 1a. Rotation of the gradiometer is indicated by direction arrows 16.

FIG. 1b illustrates a high temperature superconducting gradiometer 20 in accordance with the present invention. Gradiometer 20 comprises a first field vector sensor in the form of a SQUID 21. Gradiometer 10 further comprises a second field vector sensor in the form of a SQUID 22. SQUIDs 21 and 22 are mounted on a suitable magnetically transparent mount. Sensors 21 and 22 are positioned substantially coaxially so as to sense field vectors along axis 23. Further, sensors 21 and 22 are connected in a differencing arrangement (not shown), whereby a signal thus produced stems from the difference between the magnetic field vectors sensed by sensors 21 and 22. In accordance with the present invention, gradiometer 20 is configured to rotate about axis 25.

FIG. 2 illustrates a three-gradiometer magnetic field detection device 30 in accordance with the present invention. The gradiometers are represented by cylinders 31, 32, 33. Cylinders 31, 32, 33 are respectively positioned on axes 41, 42, 43, and each of axes 41, 42 and 43 is not parallel with either of the other two axes. Each of gradiometers 31, 32, 33 is rotatable about unique non-parallel axes in accordance with the present invention. Operation of such a device is set out in more detail in the following.

This calculation models the sensitivity of the gradiometer instrument to the magnetic field and gradient tensor in the presence of 6 pairs of misalignment angles introduced by tilting the SQUIDs through arbitrary angles. The effects of precession are not considered explicitly but can probably be modelled to sufficient accuracy within the theory. It is demonstrated that the misalignment errors lead to contamination of the gradient and B-field components by terms that depend on the misalignments, but the effects of misalignment can be removed by the theory by introducing appropriate calibrations constants. A final solution is derived in terms of instrument coordinates and the transformations to geographic coordinates is also described.

The resulting instrument provides a measurement of the true-value of the gradient and field components which is relatively robust with respect to changes in the calibration constants.

I. Overview

The present embodiment comprises of a set of three rotating axial gradiometers or drum gradiometers. In the 2-SQUID implementation the output voltages from a pair of SQUIDs operated in flux-locked loops are differenced to provide information about the magnetic field density and the first-order magnetic gradient tensor. If the SQUIDs are perfectly aligned with identical sensitivities then the difference voltage provides no information about the magnetic field density but this information is restored if the sensitivities of the SQUIDs are mismatched by a known amount. The difference voltage also provides a measurement of the first-order axial gradient provided that the contributions from higher-order gradients are sufficiently small to be ignored. This is easily seen by expanding the B-field as a Taylor series about the origin which is take to be centre point of the axial gradiometer.

A. Taylor Series for Functions of Three Variables.

The Taylor series for a scalar function B (x, y, z) about the origin is $$B(x, y, z) = \sum_{n=0}^{\infty} \frac{1}{n!}\left(x\frac{\partial}{\partial x} + y\frac{\partial}{\partial y} + z\frac{\partial}{\partial z}\right)^n B(0). \quad (1)$$

In the case of a 3-dimensional vector field the previous equation applies to each of the vector components, so the α-component of B at the point r, $B_\alpha(r)$, and at the origin, $B_\alpha(0)$, are related by $$B_\alpha(r) = \quad (2)$$
$$B_\alpha(0) + \left(x\frac{\partial}{\partial x} + y\frac{\partial}{\partial y} + z\frac{\partial}{\partial z}\right)B_\alpha + \frac{1}{2!}\left(x\frac{\partial}{\partial x} + y\frac{\partial}{\partial y} + z\frac{\partial}{\partial z}\right)^2 B_\alpha +$$
$$\frac{1}{3!}\left(x\frac{\partial}{\partial x} + y\frac{\partial}{\partial y} + z\frac{\partial}{\partial z}\right)^3 B_\alpha + \frac{1}{4!}\left(x\frac{\partial}{\partial x} + y\frac{\partial}{\partial y} + z\frac{\partial}{\partial z}\right)^4 B_\alpha + \cdots$$

If the second- and higher-order gradients of B are, small then 2 may be approximated by $$= B_\alpha(0) + \left(x\frac{\partial}{\partial x} + y\frac{\partial}{\partial y} + z\frac{\partial}{\partial z}\right)B_\alpha \quad (3)$$

provided that r is small.

Let $$g_{\alpha\beta} \triangleq \frac{\partial}{\partial \beta}B_\alpha$$

denote components of the the first-order gradients of B. Then eq. ?? becomes simply $$B_\alpha(r) \approx B_\alpha(0) + xg_{\alpha x} + yg_{\alpha y} + zg_{\alpha z} \quad (4)$$

or in coordinate independent form $$B(r) \approx B(0) + \hat{g}r \quad (5)$$

where $\hat{g}$ is the gradient matrix and r is the displacement vector to the point at which the B field is measured.

Using 5 if $r_1$ and r are two points the difference in the B-field at these points is $$B(r_1) - B(r) \approx B(0) + \hat{g}r_1 - (B(0) + \hat{g}r) = \hat{g}(r'_1 - r')$$

which is proportional to the product of the gradient matrix and the displacement between the points.

II. Instrument and Drum Coordinates.

The drum gradiometers rotate about axes with orientations denoted by the vectors U, V and W in an umbrella configuration to be described in detail below. The axial gradiometers within the drums are located at the end points of U, V and W, and facilitate absolute value measurements of linear combinations of some of the components of the magnetic gradient tensor and magnetic field with respect to a drum coordinate system, C', which is fixed to the axis of rotation of each of the three drums. The systems of equations in drum coordinates are transformed to a common instrument coordinate system, C, and solved to yield absolute value measurements of the magnetic gradient tensor and magnetic field in instrument coordinates.

For use in geophysical exploration the final measurements have to be expressed in terms of the geographic coordinate system, $C_G$. This is easily done if the orientation of C with respect to $C_G$ is known but in general this will require additional information from position and orientation sensors. It is possible that, in some applications, the real-time measurements of the magnetic field provided by the instrument itself, might be used to provide information about the orientation of the instrument with respect to the magnetic field of the earth. Transformations of the final measurements between the instrument coordinates and geographic coordinates are described below in section VI.

A. Instrument Coordinate System, C.

The instrument coordinates system, C, is a right-handed Cartesian coordinate system defined as follows. The x-y plane is defined by the base of the instrument. The z-direction is normal to the x-y plane and forms an axis of symmetry for the instrument in the sense that the three drum gradiometers are distributed symmetrically about the z-axis. Unit vectors in the directions of the x-, y- and z-axes will be denoted i, j and k, respectively.

As mentioned above the axial gradiometers are located at the end points of U, V and W and rotate about the axes defined by these vectors. The direction of U is the vector obtained by revolving a unit vector i with its base at the origin of C about the −y axis through an angle λ. The directions of V and W are obtained by revolving U about the z-axis through angles of 120° and 240° respectively. U, V and W then form a type of umbrella configuration being disposed symmetrically about the z-axis and tilted above the x-y plane through an umbrella angle angle λ. Hence $$U = (L_u \cos\lambda, 0, L_u \sin\lambda) \quad (6)$$

$$V = \left(-\frac{1}{2}L_v \cos\lambda, \frac{\sqrt{3}}{2}L_v \cos\lambda, L_v \sin\lambda\right) \quad (7)$$

$$W = \left(-\frac{1}{2}L_w \cos\lambda, -\frac{\sqrt{3}}{2}L_w \cos\lambda, L_w \sin\lambda\right) \quad (8)$$

in which $L_u$, $L_v$ and $L_w$ denote the distances of the axial gradiometers from the origin of C.

1. Properties of U, V and W.

Note that these unit vectors form an orthogonal system only if $$U \cdot V = V \cdot W = W \cdot U = 0 \quad (9)$$

i.e. if $$\frac{1}{4} - \frac{3}{4}\cos 2\lambda = 0$$

$$\Rightarrow \lambda = \frac{1}{2}\arccos\frac{1}{3} \doteq 0.61548 \text{ rad} \doteq 35.3°$$

In the instrument λ=45° so from equations 6, 7 and 8

$$U = \left(\cos\frac{\pi}{4}, 0, \sin\frac{\pi}{4}\right) \quad (10)$$
$$= L_u\left(\tfrac{1}{\sqrt{2}} \ 0 \ \tfrac{1}{\sqrt{2}}\right)$$

$$V = \left(-\frac{1}{2}\cos\frac{\pi}{4}, \frac{\sqrt{3}}{2}\cos\frac{\pi}{4}, \sin\frac{\pi}{4}\right) \quad (11)$$
$$= L_v\left(-\tfrac{1}{4}\sqrt{2} \ \tfrac{1}{4}\sqrt{6} \ \tfrac{1}{\sqrt{2}}\right)$$

$$W = \left(-\frac{1}{2}\cos\frac{\pi}{4}, -\frac{\sqrt{3}}{2}\cos\frac{\pi}{4}, \sin\frac{\pi}{4}\right) \quad (12)$$
$$= L_w\left(-\tfrac{1}{4}\sqrt{2} \ -\tfrac{1}{4}\sqrt{6} \ \tfrac{1}{\sqrt{2}}\right)$$

2. Unit Drum Vectors

It will prove useful to define the unit drum vectors, $u_0$, $v_0$ and $w_0$, that are normal to U, V and W respectively. Vector $u_0$ is the unit vector obtained by revolving a unit vector i with its base at the origin of C about the +y axis through an angle (90−λ) degrees. Vectors $v_0$ and $w_0$ are obtained by revolving $u_0$ about the z-axis through angles of 120° and 240° respectively, In instrument coordinates $$u_0 = (\sin\lambda \ 0 \ -\cos\lambda) \quad (13)$$

$$v_0 = \left(-\frac{1}{2}\sin\lambda \ \frac{\sqrt{3}}{2}(\sin\lambda) \ -\cos\lambda\right) \quad (14)$$

$$w_0 = \left(-\frac{1}{2}\sin\lambda \ -\frac{\sqrt{3}}{2}(\sin\lambda) \ -\cos\lambda\right) \quad (15)$$

N.B.

$$u_0 \cdot U = (\sin\lambda \ 0 \ -\cos\lambda) \cdot L_u(\cos\lambda, 0, \sin\lambda)$$
$$= 0$$

$$v_0 \cdot V = \left(-\frac{1}{2}\sin\lambda \ \frac{\sqrt{3}}{2}(\sin\lambda) \ -\cos\lambda\right) \cdot$$
$$L_v\left(-\frac{1}{2}\cos\lambda, \frac{\sqrt{3}}{2}\cos\lambda, \sin\lambda\right)$$
$$= 0$$

$$w_0 \cdot W = \left(-\frac{1}{2}\sin\lambda \ -\frac{\sqrt{3}}{2}(\sin\lambda) \ -\cos\lambda\right) \cdot$$
$$L_w\left(-\frac{1}{2}\cos\lambda, -\frac{\sqrt{3}}{2}\cos\lambda, \sin\lambda\right)$$
$$= 0$$

as required.

B. Drum Coordinate Systems C'

As mentioned earlier we introduce 3 drum coordinate systems, C', C" and C'" associated with the each of the three drums rotating about U, V and W respectively. Let x', y' and z' denote unit vectors in the directions of the x', y' and z' axes of the drum coordinate systems. C' is defined so that x'=$u_0$, y'=j, z'=U/$L_u$ and the origins of C'$_U$ and C coincide. With these definitions C'$_U$ is a right-handed coordinate system which would become equivalent to C if the umbrella angle was set to 90°.

C" and C'" are then defined by rotating C' about the z-axis through angles 120° and 240° so that in C", x"=$v_0$ and z"=V/$L_v$ while in C'", x'"=$w_0$ and z'"=W/$L_w$.

1. Unit Gradiometer Vectors.

The instantaneous direction of the rotating axial gradiometers will be defined, by unit gradiometer vectors u, v and w, which remain normal to U, V and W and undergo continuous rotation about the end points of U, V and W with angular frequencies $w_u$, $w_v$ and $w_w$ respectively. $\theta_u$, $\theta_v$ and $\theta_w$ will denote respectively the angular displacements of the vectors u, v and w at time t, from the positions of $u_0$, $v_0$ and $w_0$ defined above, so that $\theta_u = W_u t$, $\theta_v = w_v t$ and $\theta_w = w_w t$. In terms of the drum coordinates C'$_U$, C'$_V$ and C'$_W$ the unit gradiometer vectors u', v' and w' assume the same form $$u' = (\cos\theta_u, \sin\theta_u, 0) \quad (16)$$

$$v' = (\cos\theta_v, \sin\theta_v, 0) \quad (17)$$

$$w' = (\cos\theta_w, \sin\theta_w, 0) \quad (18)$$

C. Coordinate Transformations Between C and the C' Systems.

In general if P and P' denote the components of a vector in the frames C and C' respectively and if C is mapped to C' by a positive (right-handed) rotation through an angle κ about an axis k (k=x, y, z) then $$P' = \hat{R}_k(\kappa)P \quad (19)$$

where $\hat{R}_k(\kappa)$ denotes the standard rotation matrices $$\hat{R}_x(k) = \begin{pmatrix} 1 & 0 & 0 \\ 0 & \cos k & \sin k \\ 0 & -\sin k & \cos k \end{pmatrix} \qquad (20)$$

$$\hat{R}_y(k) = \begin{pmatrix} \cos k & 0 & -\sin k \\ 0 & 1 & 0 \\ \sin k & 0 & \cos k \end{pmatrix} \qquad (21)$$

$$\hat{R}_z(k) = \begin{pmatrix} \cos k & \sin k & 0 \\ -\sin k & \cos k & 0 \\ 0 & 0 & 1 \end{pmatrix} \qquad (22)$$

Also if $\hat{g}$ and $\hat{g}'$ are the components of a Cartesian tensor in the frames C and C' respectively then $$\hat{g}' = \hat{R}_k(\kappa)\hat{g}\hat{R}^T_k(\kappa). \qquad (23)$$

For example a rotation about the z-axis through angle $\kappa$ is $$\begin{pmatrix} g'_{11} & g'_1 & g'_{13} \\ g'_1 & g' & g'_3 \\ g'_{13} & g'_3 & g'_{33} \end{pmatrix} = \begin{pmatrix} \cos k & \sin k & 0 \\ -\sin k & \cos k & 0 \\ 0 & 0 & 1 \end{pmatrix} \begin{pmatrix} g_{11} & g_1 & g_{13} \\ g_1 & g & g_3 \\ g_{13} & g_3 & g_{33} \end{pmatrix} \begin{pmatrix} \cos k & -\sin k & 0 \\ \sin k & \cos k & 0 \\ 0 & 0 & 1 \end{pmatrix} \qquad (24)$$

and hence $$\begin{aligned}
g'_{11} &= \tfrac{1}{2}(g_{11} + g) + \tfrac{1}{2}(g_{11} - g)\cos 2k + g_1 \sin 2k \\
g' &= \tfrac{1}{2}(g_{11} + g) - \tfrac{1}{2}(g_{11} - g)(\cos 2k) - g_1 \sin 2k \\
g'_{33} &= g_{33} \\
g'_1 &= -\tfrac{1}{2}(g_{11} - g)(\sin 2k) + g_1 \cos 2k \\
g'_3 &= g_3 \cos k - g_{13} \sin k \\
g'_{13} &= g_{13} \cos k + g_3 \sin k
\end{aligned}$$

1. Transformations C$\leftrightarrows$C'.

When $x'=u_0$, $y'=j$ and $z'=U/L_u$, C is mapped onto C' by a rotation about y through an angle $(\pi/2-\lambda)$. Hence if B and B' denote the components of a vector in the frames C and C' respectively then $$B' = \begin{pmatrix} \sin\lambda & 0 & -\cos\lambda \\ 0 & 1 & 0 \\ \cos\lambda & 0 & \sin\lambda \end{pmatrix} B \qquad (25)$$

$$B = \begin{pmatrix} \sin\lambda & 0 & \cos\lambda \\ 0 & 1 & 0 \\ -\cos\lambda & 0 & \sin\lambda \end{pmatrix} B' \qquad (26)$$

N.B. If $\lambda=\pi/4$ then $$B' = \begin{pmatrix} \tfrac{1}{\sqrt{2}} & 0 & -\tfrac{1}{\sqrt{2}} \\ 0 & 1 & 0 \\ \tfrac{1}{\sqrt{2}} & 0 & \tfrac{1}{\sqrt{2}} \end{pmatrix} B \qquad (27)$$

while if $\lambda=\pi/2$ 25 and 26 give that P'=P. i.e. the coordinate systems C and C'$_U$ coincide, as required. Also, using equation 6, $$U' = \begin{pmatrix} \sin\lambda & 0 & -\cos\lambda \\ 0 & 1 & 0 \\ \cos\lambda & 0 & \sin\lambda \end{pmatrix} U$$

$$= \begin{pmatrix} \sin\lambda & 0 & -\cos\lambda \\ 0 & 1 & 0 \\ \cos\lambda & 0 & \sin\lambda \end{pmatrix} \begin{pmatrix} L_u \cos\lambda \\ 0 \\ L_u \sin\lambda \end{pmatrix}$$

$$= L_u \begin{pmatrix} 0 \\ 0 \\ 1 \end{pmatrix}$$

as required.

Using 26 the unit gradiometer vector $$u' = \begin{pmatrix} \cos\theta_u \\ \sin\theta_u \\ 0 \end{pmatrix} \qquad (28)$$

becomes $$u = \begin{pmatrix} \sin\lambda & 0 & \cos\lambda \\ 0 & 1 & 0 \\ -\cos\lambda & 0 & \sin\lambda \end{pmatrix} \begin{pmatrix} \cos\theta_u \\ \sin\theta_u \\ 0 \end{pmatrix} = \begin{pmatrix} \cos\theta_u \sin\lambda \\ \sin\theta_u \\ -\cos\theta_u \cos\lambda \end{pmatrix}$$

in C. Observe $$u \cdot U = \begin{pmatrix} \cos\theta_u \sin\lambda \\ \sin\theta_u \\ -\cos\theta_u \cos\lambda \end{pmatrix} \cdot \begin{pmatrix} L_u \cos\lambda \\ 0 \\ L_u \sin\lambda \end{pmatrix} = 0$$

so $u \perp U$ as required.

a. Gradient Transformation. The transformations of the gradient tensor from C to C' follows from the use of the transformation matrix in 25, with the general transformation equation, 23, i.e.

$$\begin{pmatrix} g'_{11} & g'_1 & g'_{13} \\ g'_1 & g' & g'_3 \\ g'_{13} & g'_3 & g'_{33} \end{pmatrix} = \qquad (29)$$

$$\begin{pmatrix} \sin\lambda & 0 & -\cos\lambda \\ 0 & 1 & 0 \\ \cos\lambda & 0 & \sin\lambda \end{pmatrix} \begin{pmatrix} g_{11} & g_1 & g_{13} \\ g_1 & g & g_3 \\ g_{13} & g_3 & g_{33} \end{pmatrix} \begin{pmatrix} \sin\lambda & 0 & \cos\lambda \\ 0 & 1 & 0 \\ -\cos\lambda & 0 & \sin\lambda \end{pmatrix}$$

$$g'_{11} = \tfrac{1}{}(g_{11} + g_{33} - g_{11}\cos 2\lambda + g_{33}\cos 2\lambda - 2g_{13}\sin 2\lambda)$$
$$g' = g$$
$$\Rightarrow g'_{33} = \tfrac{1}{}(g_{11} + g_{33} + g_{11}\cos 2\lambda - g_{33}\cos 2\lambda + 2g_{13}\sin 2\lambda)$$
$$g'_1 = \tfrac{1}{\sqrt{2}}(g_1 - g_3)$$
$$g'_{13} = -\tfrac{1}{}(2g_{13}\cos 2\lambda - g_{11}\sin 2\lambda + g_{33}\sin 2\lambda)$$
$$g'_3 = \tfrac{1}{\sqrt{2}}(g_1 + g_3)$$
(30)

In the special case $\lambda = \pi/4$ $$\left.\begin{array}{l} g'_{11} = \tfrac{1}{}g_{11} - g_{13} + \tfrac{1}{}g_{33} \\ g' = g \\ g'_{33} = \tfrac{1}{}g_{11} + g_{13} + \tfrac{1}{}g_{33} \\ g'_1 = \tfrac{1}{\sqrt{2}}(g_1 - g_3) \\ g'_{13} = \tfrac{1}{}g_{11} - \tfrac{1}{}g_{33} \\ g'_3 = \tfrac{1}{\sqrt{2}}(g_1 + g_3) \end{array}\right\}.$$
(31)

2. Transformations $C \leftrightarrows C''$.

When $x'' = v_0$ and $z'' = V/L_v$, $C$ is mapped onto $C''$ by a rotation about z through an angle $2\pi/3$ followed by a rotation about y through an angle $(\pi/2 - \lambda)$ $$B'' = \begin{pmatrix} -\tfrac{1}{}\sin\lambda & \tfrac{1}{\sqrt{3}}(\sin\lambda) & -\cos\lambda \\ -\tfrac{1}{\sqrt{3}} & -\tfrac{1}{} & 0 \\ -\tfrac{1}{}\cos\lambda & \tfrac{1}{\sqrt{3}}(\cos\lambda) & \sin\lambda \end{pmatrix} B$$
(32)

$$B = \begin{pmatrix} -\tfrac{1}{}\sin\lambda & -\tfrac{1}{\sqrt{3}} & -\tfrac{1}{}\cos\lambda \\ \tfrac{1}{\sqrt{3}}(\sin\lambda) & -\tfrac{1}{} & \tfrac{1}{\sqrt{3}}(\cos\lambda) \\ -\cos\lambda & 0 & \sin\lambda \end{pmatrix} B''$$
(33)

If $\lambda = \pi/4$ $$B'' = \begin{pmatrix} -\tfrac{1}{4}\sqrt{2} & \tfrac{1}{4}\sqrt{6} & -\tfrac{1}{}\sqrt{2} \\ -\tfrac{1}{\sqrt{3}} & -\tfrac{1}{} & 0 \\ -\tfrac{1}{4}\sqrt{2} & \tfrac{1}{4}\sqrt{6} & \tfrac{1}{}\sqrt{2} \end{pmatrix} B.$$

Using 33 the unit gradiometer vector $$v'' = \begin{pmatrix} \cos\theta_v \\ \sin\theta_v \\ 0 \end{pmatrix}$$
(34)

becomes $$v = \begin{pmatrix} -\tfrac{1}{}\sin\lambda & -\tfrac{1}{\sqrt{3}} & -\tfrac{1}{}\cos\lambda \\ \tfrac{1}{\sqrt{3}}(\sin\lambda) & -\tfrac{1}{} & \tfrac{1}{\sqrt{3}}(\cos\lambda) \\ -\cos\lambda & 0 & \sin\lambda \end{pmatrix} \begin{pmatrix} \cos\theta_v \\ \sin\theta_v \\ 0 \end{pmatrix} =$$

$$\begin{pmatrix} -\tfrac{1}{}\sin\lambda\cos\theta_v - \tfrac{1}{\sqrt{3}}(\sin\theta_v) \\ -\tfrac{1}{}\sin\theta_v + \tfrac{1}{\sqrt{3}}(\sin\lambda\cos\theta_v) \\ -\cos\lambda\cos\theta_v \end{pmatrix}$$

in C.

Observe that $$v \cdot V = 0$$

confirming that $v \perp V$ as required. Also using 6

$$V'' = \begin{pmatrix} -\tfrac{1}{}\sin\lambda & \tfrac{1}{\sqrt{3}}(\sin\lambda) & -\cos\lambda \\ -\tfrac{1}{\sqrt{3}} & -\tfrac{1}{} & 0 \\ -\tfrac{1}{}\cos\lambda & \tfrac{1}{\sqrt{3}}(\cos\lambda) & \sin\lambda \end{pmatrix} V$$

$$= \begin{pmatrix} -\tfrac{1}{}\sin\lambda & \tfrac{1}{\sqrt{3}}(\sin\lambda) & -\cos\lambda \\ -\tfrac{1}{\sqrt{3}} & -\tfrac{1}{} & 0 \\ -\tfrac{1}{}\cos\lambda & \tfrac{1}{\sqrt{3}}(\cos\lambda) & \sin\lambda \end{pmatrix} \begin{pmatrix} -L_v\cos\lambda \\ \tfrac{\sqrt{3}}{}L_v\cos\lambda \\ L_v\sin\lambda \end{pmatrix}$$

$$= L_v \begin{pmatrix} 0 \\ 0 \\ 1 \end{pmatrix}$$

as required.

a. Gradient Transformation. The transformations of the gradient tensor from C to C' follows from the use of the transformation matrix in 32, with the general transformation equation, 23, i.e.

$$\begin{pmatrix} g''_{11} & g''_1 & g''_{13} \\ g''_1 & g'' & g''_3 \\ g''_{13} & g''_3 & g''_{33} \end{pmatrix} = \begin{pmatrix} -\tfrac{1}{}\sin\lambda & \tfrac{\sqrt{3}}{}(\sin\lambda) & -\cos\lambda \\ -\tfrac{\sqrt{3}}{} & -\tfrac{1}{} & 0 \\ -\tfrac{1}{}\cos\lambda & \tfrac{\sqrt{3}}{}(\cos\lambda) & \sin\lambda \end{pmatrix}$$
(35)

$$\begin{pmatrix} g_{11} & g_1 & g_{13} \\ g_1 & g & g_3 \\ g_{13} & g_3 & g_{33} \end{pmatrix} \begin{pmatrix} -\tfrac{1}{}\sin\lambda & -\tfrac{\sqrt{3}}{} & -\tfrac{1}{}\cos\lambda \\ \tfrac{\sqrt{3}}{}(\sin\lambda) & -\tfrac{1}{} & \tfrac{\sqrt{3}}{}(\cos\lambda) \\ -\cos\lambda & 0 & \sin\lambda \end{pmatrix}$$

-continued $$\begin{aligned}g''_{11} &= \tfrac{1}{8}g_{11} + \tfrac{3}{8}g + {}^1g_{33} - \tfrac{1}{8}g_{11}\cos 2\lambda - \tfrac{3}{8}g\cos 2\lambda + \\ &\quad {}^1g_{33}\cos 2\lambda + {}^1g_{13}\sin 2\lambda - \tfrac{1}{4}g_1\sqrt{3} + \tfrac{1}{4}g_1\sqrt{3}\cos 2\lambda - {}^1g_3\sqrt{3}\sin 2\lambda \\ g'' &= \tfrac{1}{4}g + \tfrac{1}{4}g_1\sqrt{3} + \sqrt{3}\left(\tfrac{1}{4}g_1 + \tfrac{1}{4}g_{11}\sqrt{3}\right) \\ g''_{33} &= \tfrac{1}{8}g_{11} + \tfrac{3}{8}g + {}^1g_{33} - \tfrac{1}{8}g_{11}\cos 2\lambda + \tfrac{3}{8}g\cos 2\lambda - \\ &\quad {}^1g_{33}\cos 2\lambda - {}^1g_{13}\sin 2\lambda - \tfrac{1}{4}g_1\sqrt{3} - \tfrac{1}{4}g_1\sqrt{3}\cos 2\lambda + {}^1g_3\sqrt{3}\sin 2\lambda \\ \Rightarrow & \\ g''_1 &= {}^1(\cos\lambda)g_3 - {}^1(\sin\lambda)g_1 + {}^1(\cos\lambda)g_{13}\sqrt{3} + \tfrac{1}{4}(\sin\lambda)\\ &\quad g_{11}\sqrt{3} - \tfrac{1}{4}(\sin\lambda)g\sqrt{3} \\ g''_{13} &= {}^1g_{13}\cos 2\lambda + \tfrac{1}{8}g_{11}\sin 2\lambda + \tfrac{3}{8}g\sin 2\lambda - {}^1g_{33}\sin 2\lambda - {}^1g_3\\ &\quad \sqrt{3}\cos 2\lambda - \tfrac{1}{4}g_1\sqrt{3}\sin 2\lambda \\ g''_3 &= -{}^1(\cos\lambda)g_1 - {}^1(\sin\lambda)g_3 + \tfrac{1}{4}(\cos\lambda)g_{11}\sqrt{3} - \tfrac{1}{4}(\cos\lambda)g\\ &\quad \sqrt{3} - {}^1(\sin\lambda)g_{13}\sqrt{3}\end{aligned} \quad (36)$$

In the special case $\lambda = \pi/4$ $$\begin{aligned}g''_{11} &= \tfrac{1}{8}g_{11} + {}^1g_{13} + \tfrac{3}{8}g + {}^1g_{33} - \tfrac{1}{4}\sqrt{3}\,g_1 - {}^1g_3\sqrt{3} \\ g'' &= \tfrac{3}{4}g_{11} + \tfrac{1}{4}g + {}^1g_1\sqrt{3} \\ g''_{33} &= \tfrac{1}{8}g_{11} - {}^1g_{13} + \tfrac{3}{8}g + {}^1g_{33} - \tfrac{1}{4}\sqrt{3}\,g_1 + \sqrt{3}\,g_3 \\ g''_1 &= -\tfrac{1}{4}\sqrt{2}\,g_1 + \tfrac{1}{4}\sqrt{2}\,g_3 + \tfrac{1}{8}\sqrt{6}\,g_{11} + \tfrac{1}{4}\sqrt{6}\,g_{13} - \tfrac{1}{8}\sqrt{6}\,g \\ g''_{13} &= \tfrac{1}{8}g_{11} + \tfrac{3}{8}g - {}^1g_{33} - \tfrac{1}{4}\sqrt{3}\,g_1 \\ g''_3 &= -\tfrac{1}{4}\sqrt{2}\,g_1 - \tfrac{1}{4}\sqrt{2}\,g_3 + \tfrac{1}{8}\sqrt{6}\,g_{11} - \tfrac{1}{4}\sqrt{6}\,g_{13} - \tfrac{1}{8}\sqrt{6}\,g\end{aligned} \quad (37)$$

3. Transformations $C \leftrightarrows C'''$.

When $x''' = w_0$ and $z''' = W/L_w$, C is mapped onto C''' by a rotation about z through an angle $4\pi/3$ followed by a rotation about y through an angle $(\pi/2 - \lambda)$. Hence $$B''' = \begin{pmatrix} -{}^1\sin\lambda & -{}^1\sqrt{3}(\sin\lambda) & -\cos\lambda \\ {}^1\sqrt{3} & -{}^1 & 0 \\ -{}^1\cos\lambda & -{}^1\sqrt{3}(\cos\lambda) & \sin\lambda \end{pmatrix} B \quad (38)$$

$$B = \begin{pmatrix} -{}^1\sin\lambda & {}^1\sqrt{3} & -{}^1\cos\lambda \\ -{}^1\sqrt{3}(\sin\lambda) & -{}^1 & -{}^1\sqrt{3}(\cos\lambda) \\ -\cos\lambda & 0 & \sin\lambda \end{pmatrix} B''' \quad (39)$$

If $\lambda = \pi/4$ $$B''' = \begin{pmatrix} -\tfrac{1}{4}\sqrt{2} & -\tfrac{1}{4}\sqrt{6} & -\tfrac{1}{\sqrt{2}} \\ {}^1\sqrt{3} & -{}^1 & 0 \\ -\tfrac{1}{4}\sqrt{2} & -\tfrac{1}{4}\sqrt{6} & \tfrac{1}{\sqrt{2}} \end{pmatrix} B. \quad (40)$$

Using 39 the unit gradiometer vector $$w''' = \begin{pmatrix} \cos\theta_w \\ \sin\theta_w \\ 0 \end{pmatrix} \quad (41)$$

becomes $$w = \begin{pmatrix} -{}^1\sin\lambda & {}^1\sqrt{3} & -{}^1\cos\lambda \\ -{}^1\sqrt{3}(\sin\lambda) & -{}^1 & -{}^1\sqrt{3}(\cos\lambda) \\ -\cos\lambda & 0 & \sin\lambda \end{pmatrix} \begin{pmatrix} \cos\theta_v \\ \sin\theta_v \\ 0 \end{pmatrix} =$$

$$\begin{pmatrix} -{}^1\sin\lambda\cos\theta_v + {}^1\sqrt{3}(\sin\theta_v) \\ -{}^1\sin\theta_v - {}^1\sqrt{3}(\sin\lambda\cos\theta_v) \\ -\cos\lambda\cos\theta_v \end{pmatrix}$$

in C.

Observe that $$w \cdot W = 0$$

confirming that $w \perp W$ as required. Also using equation 8

$$W''' = \begin{pmatrix} -{}^1\sin\lambda & -{}^1\sqrt{3}(\sin\lambda) & -\cos\lambda \\ {}^1\sqrt{3} & -{}^1 & 0 \\ -{}^1(\cos\lambda) & -{}^1\sqrt{3}(\cos\lambda) & \sin\lambda \end{pmatrix} W$$

$$= \begin{pmatrix} -{}^1\sin\lambda & -{}^1\sqrt{3}(\sin\lambda) & -\cos\lambda \\ {}^1\sqrt{3} & -{}^1 & 0 \\ -{}^1(\cos\lambda) & -{}^1\sqrt{3}(\cos\lambda) & \sin\lambda \end{pmatrix} \begin{pmatrix} -{}^1L_w\cos\lambda \\ -\tfrac{\sqrt{3}}{\phantom{1}}L_w\cos\lambda \\ L_w\sin\lambda \end{pmatrix}$$

$$= L_w \begin{pmatrix} 0 \\ 0 \\ 1 \end{pmatrix}$$

as required.

a. Gradient Transformation. The transformations of the gradient tensor from C to C''' follows from the use of the transformation matrix in 38, with the general transformation equation, 23, i.e.

$$\begin{pmatrix} g'''_{11} & g'''_1 & g'''_{13} \\ g'''_1 & g''' & g'''_3 \\ g'''_{13} & g'''_3 & g'''_{33} \end{pmatrix} = \begin{pmatrix} -\frac{1}{}\sin\lambda & -\frac{\sqrt{3}}{}(\sin\lambda) & -\cos\lambda \\ \frac{\sqrt{3}}{} & -1 & 0 \\ -\frac{1}{}\cos\lambda & -\frac{\sqrt{3}}{}(\cos\lambda) & \sin\lambda \end{pmatrix} \quad (42)$$

$$\begin{pmatrix} g_{11} & g_1 & g_{13} \\ g_1 & g & g_3 \\ g_{13} & g_3 & g_{33} \end{pmatrix} \begin{pmatrix} -\frac{1}{}\sin\lambda & \frac{\sqrt{3}}{} & -\frac{1}{}\cos\lambda \\ -\frac{\sqrt{3}}{}(\sin\lambda) & -1 & -\frac{\sqrt{3}}{}(\cos\lambda) \\ -\cos\lambda & 0 & \sin\lambda \end{pmatrix}$$

$$\left.\begin{aligned}
g'''_{11} &= \tfrac{1}{8}g_{11} + \tfrac{3}{8}g + \tfrac{1}{}g_{33} - \tfrac{1}{8}g_{11}\cos2\lambda - \tfrac{3}{8}g\cos2\lambda + \\
&\quad \tfrac{1}{}g_{33}\cos2\lambda + \tfrac{1}{}g_{13}\sin2\lambda + \tfrac{1}{4}g_1\sqrt{3} - \tfrac{1}{4}g_1\sqrt{3}\cos2\lambda + g_3\sqrt{3}\sin2\lambda \\
g''' &= \tfrac{3}{4}g_{11} + \tfrac{1}{4}g - \tfrac{1}{}g_1\sqrt{3} \\
g'''_{33} &= \tfrac{1}{8}g_{11} + \tfrac{3}{8}g + \tfrac{1}{}g_{33} + \tfrac{1}{8}g_{11}\cos2\lambda + \tfrac{3}{8}g\cos2\lambda - \\
&\quad \tfrac{1}{}g_{33}\cos2\lambda - \tfrac{1}{}g_{13}\sin2\lambda + \tfrac{1}{4}g_1\sqrt{3} + \tfrac{1}{4}g_1\sqrt{3}\cos2\lambda - \tfrac{1}{}g_3\sqrt{3}\sin2\lambda \\
&\Rightarrow \\
g'''_1 &= \tfrac{1}{}(\cos\lambda)g_3 - \tfrac{1}{}(\sin\lambda)g_1 - \tfrac{1}{}(\cos\lambda)g_{13}\sqrt{3} - \tfrac{1}{4}(\sin\lambda) \\
&\quad g_{11}\sqrt{3} + \tfrac{1}{4}(\sin\lambda)g\sqrt{3} \\
g'''_{13} &= \tfrac{1}{}g_{13}\cos2\lambda + \tfrac{1}{8}g_{11}\sin2\lambda + \tfrac{3}{8}g\sin2\lambda - \tfrac{1}{}g_{33}\sin2\lambda + \tfrac{1}{}g_3 \\
&\quad \sqrt{3}\cos2\lambda + \tfrac{1}{4}g_1\sqrt{3}\sin2\lambda \\
g'''_3 &= -\tfrac{1}{}(\cos\lambda)g_1 - \tfrac{1}{}(\sin\lambda)g_3 - \tfrac{1}{4}(\cos\lambda)g_{11}\sqrt{3} + \tfrac{1}{4}(\cos\lambda)g \\
&\quad \sqrt{3} + \tfrac{1}{}(\sin\lambda)g_{13}\sqrt{3}
\end{aligned}\right\} \quad (43)$$

In the special case $\lambda = \pi/4$ $$\left.\begin{aligned}
g'''_{11} &= \tfrac{1}{8}g_{11} + \tfrac{1}{}g_{13} + \tfrac{3}{8}g + \tfrac{1}{}g_{33} + \tfrac{1}{4}\sqrt{3}g_1 + \sqrt{3}g_3 \\
g''' &= \tfrac{3}{4}g_{11} + \tfrac{1}{4}g - \tfrac{1}{}\sqrt{3}g_1 \\
g'''_{33} &= \tfrac{1}{8}g_{11} - \tfrac{1}{}g_{13} + \tfrac{3}{8}g + \tfrac{1}{}g_{33} + \tfrac{1}{4}\sqrt{3}g_1 - \tfrac{1}{}\sqrt{3}g_3 \\
g'''_1 &= -\tfrac{1}{4}\sqrt{2}g_1 + \tfrac{1}{4}\sqrt{2}g_3 - \tfrac{1}{8}\sqrt{6}g_{11} - \tfrac{1}{4}\sqrt{6}g_{13} + \tfrac{1}{8}\sqrt{6}g \\
g'''_{13} &= \tfrac{1}{8}g_{11} + \tfrac{3}{8}g - \tfrac{1}{}g_{33} + \tfrac{1}{4}\sqrt{3}g_1 \\
g'''_3 &= -\tfrac{1}{4}\sqrt{2}g_1 - \tfrac{1}{4}\sqrt{2}g_3 - \tfrac{1}{8}\sqrt{6}g_{11} + \tfrac{1}{4}\sqrt{6}g_{13} + \tfrac{1}{8}\sqrt{6}g
\end{aligned}\right\} \quad (44)$$

D. SQUID Configuration

The SQUIDs composing the axial gradiometer rotating about U are located at the endpoints of the vectors $r = U \pm \rho u$, where $\rho = d/2$ and d is the total distance between the SQUIDs. In drum coordinates $$r'_+ = U' + \rho u' = \begin{pmatrix} 0 \\ 0 \\ L_u \end{pmatrix} + \begin{pmatrix} \rho\cos\theta_u \\ \rho\sin\theta_u \\ 0 \end{pmatrix} = \begin{pmatrix} \rho\cos\theta_u \\ \rho\sin\theta_u \\ L_u \end{pmatrix} \quad (45)$$

$$r'_- = U' - \rho u' = \begin{pmatrix} 0 \\ 0 \\ L_u \end{pmatrix} - \begin{pmatrix} \rho\cos\theta_u \\ \rho\sin\theta_u \\ 0 \end{pmatrix} = \begin{pmatrix} -\rho\cos\theta_u \\ -\rho\sin\theta_u \\ L_u \end{pmatrix} \quad (46)$$

Using eqs. 45 and 46 in equation 5 the magnetic field at the SQUIDs may be written $$\begin{aligned}
B'_+(r'_+) &= \begin{pmatrix} B'_x \\ B'_y \\ B'_z \end{pmatrix} + \begin{pmatrix} g'_{xx} & g'_{xy} & g'_{xz} \\ g'_{yx} & g'_{yy} & g'_{yz} \\ g'_{zx} & g'_{zy} & g'_{zz} \end{pmatrix} \begin{pmatrix} \rho\cos\theta_u \\ \rho\sin\theta_u \\ L_u \end{pmatrix} \\
&= \begin{pmatrix} B'_x + L_u g'_{xz} + \rho(\sin\theta_u)g'_{xy} + \rho(\cos\theta_u)g'_{xx} \\ B'_y + L_u g'_{yz} + \rho(\cos\theta_u)g'_{xy} + \rho(\sin\theta_u)g'_{yy} \\ B'_z + \rho(\cos\theta_u)g'_{xz} + \rho(\sin\theta_u)g'_{yz} + L_u g'_{zz} \end{pmatrix}
\end{aligned} \quad (47)$$

$$\begin{aligned}
B'_-(r'_-) &= \begin{pmatrix} B'_x \\ B'_y \\ B'_z \end{pmatrix} + \begin{pmatrix} g'_{xx} & g'_{xy} & g'_{xz} \\ g'_{yx} & g'_{yy} & g'_{yz} \\ g'_{zx} & g'_{zy} & g'_{zz} \end{pmatrix} \begin{pmatrix} -\rho\cos\theta_u \\ -\rho\sin\theta_u \\ L_u \end{pmatrix} \\
&= \begin{pmatrix} B'_x + L_u g'_{xz} - \rho(\sin\theta_u)g'_{xy} - \rho(\cos\theta_u)g'_{xx} \\ B'_y + L_u g'_{yz} - \rho(\cos\theta_u)g'_{xy} - \rho(\sin\theta_u)g'_{yy} \\ B'_z - \rho(\cos\theta_u)g'_{xz} - \rho(\sin\theta_u)g'_{yz} + L_u g'_{zz} \end{pmatrix}
\end{aligned} \quad (48)$$

in which $$B' \triangleq \begin{pmatrix} B'_x \\ B'_y \\ B'_z \end{pmatrix} \quad (49)$$

is the magnetic field at the origin of C'.

E. SQUID outputs.

In the instrument the gradiometer signal is produced by forming the sum $$U = U_+ + U_- \quad (50)$$

where $U_+$ and $U_-$ are the responses of the SQUIDs when operated in a flux-locked loop. In response to the magnetic fields in equations 47 and 48 $U_+$ and $U_-$ may be written $$U_+ = S'_1 \cdot B'_+(r'_+) + a_+ \quad (51)$$

$$U_- = S' \cdot B'_-(r'_-) + a_- \quad (52)$$

where the $S'_1$ and $S'$ denote the SQUID sensitivity vectors. These are normal to the SQUIDs with lengths proportional to the sensitivity of the SQUID system (V/T) and the a are arbitrary offset voltages which can change value upon each reset of the SQUID system electronics. In a perfectly aligned system $S'_1 = S_1 u'$ and $S' = -S u'$ but in any real system the SQUID vectors will be tilted with respect to u' due to alignment errors. To characterize the alignment we introduce 2 pairs of alignment error angles. Let $\sigma_1(\sigma)$ denote the error angle between the projection of the $S'_1(S')$ vector onto the x'-y' plane and the unit vectors u'(-u'), and $\tau_1(\tau)$ is the angle of inclination of $S'_1(S')$ above the x'-y' plane. Then $$S'_1 = \begin{pmatrix} S_1 \cos\tau_1 \cos\theta_1 \\ S_1 \cos\tau_1 \sin\theta_1 \\ S_1 \sin\tau_1 \end{pmatrix}, \theta_1 \triangleq (\theta_u + \sigma_1) \quad (53)$$

$$S' = \begin{pmatrix} -S\cos\tau\cos\theta \\ -S\cos\tau\sin\theta \\ S\sin\tau \end{pmatrix}, \theta \triangleq (\theta_u + \sigma) \quad (54)$$

If $\sigma_1 = \sigma = \tau_1 = \tau = 0$ then $S'_1 = S_1 u'$ and $S' = -S u'$ as required.

To simplify these introduce $$M_1 \triangleq S_1\cos\tau_1, \; N_1 \triangleq S_1\sin\tau_1 \atop M \triangleq S\cos\tau, \; N \triangleq S\sin\tau \Big\} \quad (55)$$

so that 53 and 54 become $$S'_1 = \begin{pmatrix} M_1\cos\theta_1 \\ M_1\sin\theta_1 \\ N_1 \end{pmatrix} \quad (56)$$

$$S' = \begin{pmatrix} -M\cos\theta \\ -M\sin\theta \\ N \end{pmatrix} \quad (57)$$

Using 47 and 56 in equation 51 gives $$U_+ = \begin{pmatrix} M_1\cos\theta_1 \\ M_1\sin\theta_1 \\ N_1 \end{pmatrix} \cdot \begin{pmatrix} B'_x + L_u g'_{xz} + \rho(\sin\theta_u) g'_{xy} + \rho(\cos\theta_u) g'_{xx} \\ B'_y + L_u g'_{yz} + \rho(\cos\theta_u) g'_{xy} + \rho(\sin\theta_u) g'_{yy} \\ B'_z + \rho(\cos\theta_u) g'_{xz} + \rho(\sin\theta_u) g'_{yz} + L_u g'_{zz} \end{pmatrix} + a_+ \quad (58)$$

$$= (M_1\cos\theta_1)(B'_x + L_u g'_{xz} + \rho(\sin\theta_u) g'_{xy} + \rho(\cos\theta_u) g'_{xx}) \quad (59)$$

$$+ (M_1\sin\theta_1)(B'_y + L_u g'_{yz} + \rho(\cos\theta_u) g'_{xy} + \rho(\sin\theta_u) g'_{yy}) \quad (60)$$

$$+ (N_1)(B'_z + \rho(\cos\theta_u) g'_{xz} + \rho(\sin\theta_u) g'_{yz} + L_u g'_{zz}) + a_+ \quad (61)$$

$$= B'_x M_1 \cos\theta_1 + L_u g'_{xz} M_1 \cos\theta_1 + g'_{xx}\rho M_1 (\cos\theta_u)(\cos\theta_1) + \quad (62)$$
$$g'_{xy}\rho M_1 (\sin\theta_u)(\cos\theta_1)$$
$$+ B'_y M_1 \sin\theta_1 + g'_{yz} L_u M_1 \sin\theta_1 + g'_{yy}\rho M_1 (\sin\theta_u)(\sin\theta_1) +$$
$$g'_{xy}\rho M_1 (\cos\theta_u)(\sin\theta_1)$$
$$+ B'_z N_1 + g'_{zz} N_1 L_u + g'_{xz} N_1 \rho (\cos\theta_u) + g'_{yz} N_1 \rho (\sin\theta_u) + a_+$$

where we have used that $g_{xy}=g_{yx}$, $g_{xz}=g_{zx}$ and $g_{yz}=g_{zy}$ from our knowledge of the properties of the magnetic gradient tensor.

Similarly using 48 and 57 in equation 52 gives $$U_- = \begin{pmatrix} -M\cos\theta \\ -M\sin\theta \\ N \end{pmatrix} \cdot \begin{pmatrix} B'_x + L_u g'_{xz} - \rho(\sin\theta_u) g'_{xy} - \rho(\cos\theta_u) g'_{xx} \\ B'_y + L_u g'_{yz} - \rho(\cos\theta_u) g'_{xy} - \rho(\sin\theta_u) g'_{yy} \\ B'_z + \rho(\cos\theta_u) g'_{xz} + \rho(\sin\theta_u) g'_{yz} + L_u g'_{zz} \end{pmatrix} + a_- \quad (63)$$

$$= (-M\cos\theta)(B'_x + L_u g'_{xz} - \rho(\sin\theta_u) g'_{xy} - \rho(\cos\theta_u) g'_{xx}) \quad (64)$$

$$+ (-M\sin\theta)(B'_y + L_u g'_{yz} - \rho(\cos\theta_u) g'_{xy} - \rho(\sin\theta_u) g'_{yy}) \quad (65)$$

$$+ (N)(B'_z - \rho(\cos\theta_u) g'_{xz} - \rho(\sin\theta_u) g'_{yz} + L_u g'_{zz}) + a_- \quad (66)$$

-continued
$$= -B'_x M\cos\theta - L_u g'_{xz} M\cos\theta + M\rho g'_{xx}(\cos\theta_u)(\cos\theta) + \quad (67)$$
$$M\rho g'_{xy}(\sin\theta_u)(\cos\theta)$$
$$- M B'_y(\sin\theta) - g'_{yz} M L_u (\sin\theta) + g'_{yy} M \rho (\sin\theta_u)(\sin\theta) +$$
$$g'_{xy} M \rho (\cos\theta_u)(\sin\theta)$$
$$+ B'_z N + g'_{zz} N L_u - g'_{xz} N \rho (\cos\theta_u) - g'_{yz} N \rho (\sin\theta_u) + a_-$$

Substituting 62 and 67 into 50 gives the gradiometer output $$U = B'_x M_1 \cos\theta_1 + L_u g'_{xz} M_1 \cos\theta_1 + g'_{xx}\rho M_1 (\cos\theta_u)(\cos\theta_1) +$$
$$g'_{xy}\rho M_1 (\sin\theta_u)(\cos\theta_1)$$
$$- B'_x M\cos\theta - L_u g'_{xz} M\cos\theta + M\rho g'_{xx}(\sin\theta_u)(\cos\theta) +$$
$$M\rho g'_{xy}(\cos\theta_u)(\cos\theta)$$
$$+ B'_y M_1 \sin\theta_1 + g'_{yz} L_u M_1 \sin\theta_1 + g'_{yy}\rho M_1 (\sin\theta_u)(\sin\theta_1) +$$
$$g'_{xy}\rho M_1 (\cos\theta_u)(\sin\theta_1)$$
$$- M B'_y(\sin\theta) - g'_{yz} M L_u (\sin\theta) + g'_{xy} M \rho (\cos\theta_u)(\sin\theta) +$$
$$g'_{yy} M \rho (\sin\theta_u)(\sin\theta)$$
$$+ B'_z N_1 + g'_{zz} N_1 L_u + g'_{xz} N_1 \rho (\cos\theta_u) + g'_{yz} N_1 \rho (\sin\theta_1) + a_+$$
$$+ B'_z N + g'_{zz} N L_u - g'_{xz} N \rho (\cos\theta_u) - g'_{yz} N \rho (\sin\theta_u) + a_-$$
$$= B'_x M_1 \cos(\theta_u + \sigma_1) + L_u g'_{xz} M_1 \cos(\theta_u + \sigma_1) +$$
$$g'_{xx}\rho M_1 (\cos\theta_u)(\cos(\theta_u + \sigma_1))$$
$$+ g'_{xy}\rho M_1 (\sin\theta_u)(\cos(\theta_u + \sigma_1)) - B'_x M\cos(\theta_u + \sigma) -$$
$$L_u g'_{xz} M\cos(\theta_u + \sigma)$$
$$+ M\rho g'_{xy}(\sin\theta_u)(\cos(\theta_u + \sigma)) + M\rho g'_{xx}(\cos\theta_u)(\cos(\theta_u + \sigma))$$
$$+ B'_y M_1 \sin(\theta_u + \sigma_1) + g'_{yz} L_u M_1 \sin(\theta_u + \sigma_1) +$$
$$g'_{yy}\rho M_1 (\sin\theta_u)(\sin(\theta_u + \sigma_1))$$
$$+ g'_{xy}\rho M_1 (\cos\theta_u)(\sin(\theta_u + \sigma_1)) - M B'_y (\sin(\theta_u + \sigma))$$
$$- g'_{yz} M L_u (\sin(\theta_u + \sigma)) + g'_{xy} M \rho (\cos\theta_u)(\sin(\theta_u + \sigma))$$
$$+ g'_{yy} M \rho (\sin\theta_u)(\sin(\theta_u + \sigma)) + B'_z N_1 + g'_{zz} N_1 L_u + g'_{xz} N_1 \rho (\cos\theta_u)$$
$$+ g'_{yz} N_1 \rho (\sin\theta_u) + a_+ + B'_z N + g'_{zz} N L_u$$
$$- g'_{xz} N \rho (\cos\theta_u) - g'_{yz} N \rho (\sin\theta_u) + a_-$$
$$= B'_x M_1 (\cos\sigma_1 \cos\theta_u - \sin\sigma_1 \sin\theta_u) + L_u g'_{xz} M_1 (\cos\sigma_1 \cos\theta_u - \sin\sigma_1 \sin\theta_u)$$
$$+ g'_{xx}\rho M_1 (\cos\sigma_1 \cos\theta_u - \sin\sigma_1 \cos\theta_u \sin\theta_u) + g'_{xy}\rho M_1$$
$$(\cos\sigma_1 \cos\theta_u \sin\theta_u - \sin\sigma_1 \sin\theta_u)$$
$$- B'_x M (\cos\sigma \cos\theta_u - \sin\sigma \sin\theta_u) - L_u g'_{xz} M (\cos\sigma \cos\theta_u - \sin\sigma \sin\theta_u)$$
$$+ M\rho g'_{xy}(\cos\sigma \cos\theta_u \sin\theta_u - \sin\sigma \sin\theta_u) +$$
$$M\rho g'_{xx}(\cos\sigma \cos\theta_u - \sin\sigma \cos\theta_u \sin\theta_u)$$
$$+ B'_y M_1 (\cos\sigma_1 \sin\theta_u + \sin\sigma_1 \cos\theta_u) + g'_{yz} L_u M_1 (\cos\sigma_1 \sin\theta_u +$$
$$\sin\sigma_1 \cos\theta_u) + g'_{yy}\rho M_1 (\sin\sigma_1 \cos\theta_u \sin\theta_u + \cos\sigma_1 \sin\theta_u) +$$
$$g'_{xy}\rho M_1 (\cos\sigma_1 \cos\theta_u \sin\theta_u + \sin\sigma_1 \cos\theta_u)$$
$$- M B'_y (\cos\sigma \sin\theta_u + \sin\sigma \cos\theta_u) - g'_{yz} M L_u (\cos\sigma \sin\theta_u + \sin\sigma \cos\theta_u)$$
$$+ g'_{xy} M \rho (\cos\sigma \cos\theta_u \sin\theta_u + \sin\sigma \cos\theta_u) +$$
$$g'_{yy} M \rho (\sin\sigma \cos\theta_u \sin\theta_u + \cos\sigma \sin\theta_u)$$
$$+ B'_z N_1 + g'_{zz} N_1 L_u + g'_{xz} N_1 \rho (\cos\theta_u) + g'_{yz} N_1 \rho (\sin\theta_u) + a_+$$
$$+ B'_z N + g'_{zz} N L_u - g'_{xz} N \rho (\cos\theta_u) - g'_{yz} N \rho (\sin\theta_u) + a_-$$

-continued
$$\begin{aligned}
= & B'_x M_1 \cos\sigma_1 \cos\theta_u - B'_x M_1 \sin\sigma_1 \sin\theta_u + L_u g'_{xz} M_1 \cos\sigma_1 \cos\theta_u \\
& - L_u g'_{xz} M_1 \sin\sigma_1 \sin\theta_u + g'_{xx} \rho M_1 \cos\sigma_1 \cos\theta_u - g'_{xx} \rho M_1 \sin\sigma_1 \cos\theta_u \sin\theta_u \\
& + g'_{xy} \rho M_1 \cos\sigma_1 \cos\theta_u \sin\theta_u - g'_{xy} \rho M_1 \sin\sigma_1 \sin\theta_u - B'_x M \cos\sigma \cos\theta_u \\
& + B'_x M \sin\sigma \sin\theta_u - L_u g'_{xz} M \cos\sigma \cos\theta_u + L_u g'_{xz} M \sin\sigma \sin\theta_u \\
& + M \rho g'_{xy} \cos\sigma \cos\theta_u \sin\theta_u - M \rho g'_{xy} \sin\sigma \sin\theta_u + M \rho g'_{xx} \cos\sigma \cos\theta_u \\
& - M \rho g'_{xx} \sin\sigma \cos\theta_u \sin\theta_u + B'_y M_1 \cos\sigma_1 \sin\theta_u + B'_y M_1 \sin\sigma_1 \cos\theta_u \\
& + g'_{yz} L_u M_1 \cos\sigma_1 \sin\theta_u + g'_{yz} L_u M_1 \sin\sigma_1 \cos\theta_u + g'_{yy} \rho M_1 \sin\sigma_1 \cos\theta_u \sin\theta_u \\
& + g'_{yy} \rho M_1 \cos\sigma_1 \sin\theta_u + g'_{xy} \rho M_1 \cos\sigma_1 \cos\theta_u \sin\theta_u + g'_{xy} \rho M_1 \sin\sigma_1 \cos\theta_u \\
& - M B'_y \cos\sigma \sin\theta_u - M B'_y \sin\sigma \cos\theta_u - g'_{yz} M L_u \cos\sigma \sin\theta_u \\
& - g'_{yz} M L_u \sin\sigma \cos\theta_u + g'_{xy} M \rho \cos\sigma \cos\theta_u \sin\theta_u + g'_{xy} M \rho \sin\sigma \cos\theta_u \\
& + g'_{yy} M \rho \sin\sigma \cos\theta_u \sin\theta_u + g'_{yy} M \rho \cos\sigma \sin\theta_u \\
& + B'_z N_1 + g'_{zz} N_1 L_u + g'_{xz} N_1 \rho (\cos\theta_u) + g'_{yz} N_1 \rho (\sin\theta_u) + a_+ \\
& + B'_z N + g'_{zz} N L_u - g'_{xz} N \rho (\cos\theta_u) - g'_{yz} N \rho (\sin\theta_u) + a_- \\
= & B'_x M_1 \cos\theta_u \cos\sigma_1 - B'_x M \cos\theta_u \cos\sigma \\
& + B'_x M \sin\sigma \sin\theta_u - B'_x M_1 \sin\sigma_1 \sin\theta_u \\
& + B'_y M_1 \cos\sigma_1 \sin\theta_u - B'_y M \cos\sigma \sin\theta_u \\
& + B'_y M_1 \sin\sigma_1 \cos\theta_u - B'_y M \sin\sigma \cos\theta_u \\
& + L_u g'_{xz} M_1 \cos\sigma_1 \cos\theta_u - L_u g'_{xz} M \cos\sigma \cos\theta_u \\
& - L_u g'_{xz} M_1 \sin\sigma_1 \sin\theta_u + L_u g'_{xz} M \sin\sigma \sin\theta_u \\
& + g'_{yz} L_u M_1 \cos\sigma_1 \sin\theta_u - g'_{yz} M L_u \cos\sigma \sin\theta_u \\
& + g'_{yz} L_u M_1 \sin\sigma_1 \cos\theta_u - g'_{yz} M L_u \sin\sigma \cos\theta_u \\
& + B'_z N_1 + B'_z N + g'_{zz} N_1 L_u + g'_{zz} N_1 L_u + a_+ + a_- \\
& + g'_{xx} \rho M_1 \cos\sigma_1 \cos\theta_u + M \rho g'_{xx} \cos\sigma \cos\theta_u \\
& + g'_{yy} \rho M_1 \cos\sigma_1 \sin\theta_u + g'_{yy} M \rho \cos\sigma \sin\theta_u \\
& + g'_{xy} \rho M_1 \sin\sigma_1 \cos\theta_u + g'_{xy} M \rho \sin\sigma \cos\theta_u \\
& - g'_{xy} \rho M_1 \sin\sigma_1 \sin\theta_u - M \rho g'_{xy} \sin\sigma \sin\theta_u \\
& - g'_{xx} \rho M_1 \sin\sigma_1 \cos\theta_u \sin\theta_u - M \rho g'_{xx} \sin\sigma \cos\theta_u \sin\theta_u \\
& + g'_{yy} \rho M_1 \sin\sigma_1 \cos\theta_u \sin\theta_u + g'_{yy} M \rho \sin\sigma \cos\theta_u \sin\theta_u \\
& + 2 g'_{xy} \rho M_1 \cos\sigma_1 \cos\theta_u \sin\theta_u + 2 M \rho g'_{xy} \cos\sigma \cos\theta_u \sin\theta_u \\
& + g'_{xz} N_1 \rho (\cos\theta_u) - g'_{xz} N \rho (\cos\theta_u) \\
& + g'_{yz} N_1 \rho (\sin\theta_u) - g'_{yz} N \rho (\sin\theta_u) \\
= & (M_1 \cos\sigma_1 - M \cos\sigma) B'_x \cos\theta_u \\
& + (M \sin\sigma - M_1 \sin\sigma_1) B'_x \sin\theta_u \\
& + (M_1 \cos\sigma_1 - M \cos\sigma) B'_y \sin\theta_u \\
& + (M_1 \sin\sigma_1 - M \sin\sigma) B'_y \cos\theta_u \\
& + L_u (M_1 \cos\sigma_1 - M \cos\sigma) g'_{xz} \cos\theta_u \\
& - L_u (M_1 \sin\sigma_1 - M \sin\sigma) g'_{xz} \sin\theta_u \\
& + L_u (M_1 \cos\sigma_1 - M \cos\sigma) g'_{yz} \sin\theta_u \\
& + L_u (M_1 \sin\sigma_1 - M \sin\sigma) g'_{yz} \cos\theta_u \\
& + L_u (N_1 + N) g'_{zz} \\
& + B'_z (N_1 + N) \\
& + a \\
& + \rho (M_1 \cos\sigma_1 + M \cos\sigma) g'_x (\cos\theta_u)
\end{aligned}$$

-continued
$$\begin{aligned}
& + \rho (M_1 \cos\sigma_1 + M \cos\sigma) g'_y (\sin\theta_u) \\
& + \rho (M_1 \sin\sigma_1 + M \sin\sigma) g'_{xy} (\cos\theta_u) \\
& - \rho (M_1 \sin\sigma_1 + M \sin\sigma) g'_{xy} (\sin\theta_u) \\
& - \rho (M_1 \sin\sigma_1 + M \sin\sigma) g'_x (\sin\theta_u)(\cos\theta_u) \\
& + \rho (M_1 \sin\sigma_1 + M \sin\sigma) g'_y (\sin\theta_u)(\cos\theta_u) \\
& + 2 \rho (M_1 \cos\sigma_1 + M \cos\sigma) g'_{xy} (\sin\theta_u)(\cos\theta_u) \\
& + \rho g'_{xz} (\cos\theta_u)(N_1 - N) \\
& + \rho g'_{yz} (\sin\theta_u)(N_1 - N)
\end{aligned}$$

where $a \triangleq a_+ + a_-$. Expanding the trigonometric functions within each term and collecting harmonics gives $$\begin{aligned}
U = & (L_u g'_{zz} + B'_z)(N_1 + N) + a + \frac{1}{2} \rho (M_1 \cos\sigma_1 + M \cos\sigma)(g'_{xx} + g'_{yy}) + \\
& (M_1 \cos\sigma_1 - M \cos\sigma)(B'_x + L_u g'_{xz}) \cos\theta_u + \\
& (M_1 \sin\sigma_1 - M \sin\sigma)(B'_y + L_u g'_{yz}) \cos\theta_u + \\
& \rho(N_1 - N) g'_{xz} \cos\theta_u - (M_1 \sin\sigma_1 - M \sin\sigma)(B'_x + L_u g'_{xz}) \sin\theta_u + \\
& (M_1 \cos\sigma_1 - M \cos\sigma)(B'_y + L_u g'_{yz}) \sin\theta_u + \rho(N_1 - N) g'_{yz} \sin\theta_u + \\
& \frac{1}{2} \rho (M_1 \cos\sigma_1 + M \cos\sigma)(g'_{xx} + g'_{yy}) \cos 2\theta_u + \\
& \rho (M_1 \sin\sigma_1 - M \sin\sigma) g'_{xy} \cos 2\theta_u + \\
& \frac{1}{2} \rho (M_1 \sin\sigma_1 + M \sin\sigma)(g'_{yy} - g'_{xx}) \sin 2\theta_u + \\
& \rho (M_1 \cos\sigma_1 - M \cos\sigma) g'_{xy} \sin 2\theta_u
\end{aligned} \quad (68)$$

Hence $$\begin{aligned}
U = & \mu_u (L_u g'_{zz} + B'_z) + a + \xi_u (g'_{xx} + g'_{yy}) + \varsigma_u (B'_x + L_u g'_{xz}) \cos\theta_u + \\
& \eta_u (B'_y + L_u g'_{yz}) \cos\theta_u + \upsilon_u g'_{xz} \cos\theta_u - \eta_u (B'_x + L_u g'_{xz}) \sin\theta_u + \\
& \varsigma_u (B'_y + L_u g'_{yz}) \sin\theta_u + \upsilon_u g'_{yz} \sin\theta_u + \xi_u (g'_{xx} + g'_{yy}) \cos 2\theta_u + \\
& 2 (\chi_u) g'_{xy} \cos 2\theta_u + \chi_u (g'_{yy} - g'_{xx}) \sin 2\theta_u + 2 (\xi_u) g'_{xy} \sin 2\theta_u
\end{aligned} \quad (69)$$

where $$\left.\begin{aligned}
\xi_u &\triangleq \frac{1}{2} \rho (M_1 \cos\sigma_1 + M \cos\sigma) \\
\chi_u &\triangleq \frac{1}{2} \rho (M_1 \sin\sigma_1 + M \sin\sigma) \\
\upsilon_u &\triangleq \rho (N_1 - N) \\
\varsigma_u &\triangleq (M_1 \cos\sigma_1 - M \cos\sigma) \\
\eta_u &\triangleq (M_1 \sin\sigma_1 - M \sin\sigma) \\
\mu_u &\triangleq (N_1 + N)
\end{aligned}\right\} \quad (70)$$

N.B. In the absence of alignment errors, i.e. $\sigma_1 = \sigma = 0$, $\tau_1 = \tau = 0$ from equation 55

$$\left.\begin{aligned} M_1 &= S_1, \quad N_1 = 0 \\ M &= S, \quad N = 0 \end{aligned}\right\}$$

and from equations 70 $\chi_u$, $\eta_u$, $\upsilon_u$ and $\mu_u$ vanish, and $$\left.\begin{aligned} \xi_u &= \frac{1}{2} \rho (S_1 + S) \\ \varsigma_u &= (S_1 - S) \end{aligned}\right\} \quad (71)$$

Finally if $S_1 \triangleq S$ say, then $\varsigma_u$ also vanishes and the only non-zero constant is $$\xi_u = \rho S. \tag{72}$$

III. Data Extraction

One method to extract the data is to take a series of measurements over a number of angular increments of the pick-up loop structure and solve the resulting system of equations algebraically. A series of voltage measurements is now taken at angles $\theta_u = -\pi/4, 0, \pi/4, \pi/2, 3\pi/4, \pi, 5\pi/4, 3\pi/2$ to yield the following set of equations:

$$U_0 \triangleq U(\theta = -\pi/4) = a + B_3'\mu_u + g_{11}'\xi_u + g_{11}'\chi_u - 2g_1'\xi_u + \tag{73}$$
$$g'\xi_u - g'\chi_u + L_u g_{33}'\mu_u + {}^1B_1'\eta_u\sqrt{2} + {}^1B_1'\eta_u\sqrt{2} +$$
$$ {}^1B_1'\varsigma_u\sqrt{2} - {}^1B'\varsigma_u\sqrt{2} + {}^1g_{13}'\upsilon_u\sqrt{2} - {}^1g_3'\upsilon_u\sqrt{2} +$$
$$L_u g_{13}'\eta_u{}^1\sqrt{2} + {}^1L_u g_3'\eta_u\sqrt{2} + {}^1L_u g_{13}'\varsigma_u\sqrt{2} - {}^1L_u g_3'\varsigma_u\sqrt{2}$$

$$U \triangleq U(\theta = \pi/4) = a + B_3'\mu_u + g_{11}'\xi_u - g_{11}'\chi_u + 2g_1'\xi_u +$$
$$g'\xi_u + g'\chi_u + L_u g_{33}'\mu_u - {}^1B_1'\eta_u\sqrt{2} + {}^1B'\eta_u\sqrt{2} +$$
$$ {}^1B_1'\varsigma_u\sqrt{2} + {}^1B'\varsigma_u\sqrt{2} + {}^1g_{13}'\upsilon_u\sqrt{2} + {}^1g_3'\upsilon_u\sqrt{2} -$$
$$ {}^1L_u g_3'\eta_u\sqrt{2} + {}^1L_u g_3'\eta_u\sqrt{2} + {}^1L_u g_{13}'\varsigma_u\sqrt{2} + {}^1L_u g_3'\varsigma_u\sqrt{2}$$

$$U_4 \triangleq U(\theta = 3\pi/4) = a + B_3'\mu_u + g_{11}'\xi_u + g_{11}'\chi_u - 2g_1'\xi_u +$$
$$g'\xi_u - g'\chi_u + L_u g_{33}'\mu_u - {}^1B_1'\eta_u\sqrt{2} - {}^1B'\eta_u\sqrt{2} -$$
$$ {}^1B_1'\varsigma_u\sqrt{2} + {}^1B'\varsigma_u\sqrt{2} - {}^1g_{13}'\upsilon_u\sqrt{2} + {}^1g_3'\upsilon_u\sqrt{2} -$$
$$L_u g_{13}'\eta_u\sqrt{2} - {}^1L_u g_3'\eta_u\sqrt{2} - {}^1L_u g_{13}'\varsigma_u\sqrt{2} + {}^1L_u g_3'\varsigma_u\sqrt{2}$$

$$U_6 \triangleq U(\theta = 5\pi/4) = a + B_3'\mu_u + g_{11}'\xi_u - g_{11}'\chi_u + 2g_1'\xi_u +$$
$$g'\xi_u + g'\chi_u + L_u g_{33}'\mu_u + {}^1B_1'\eta_u\sqrt{2} - {}^1B'\eta_u\sqrt{2} -$$
$$ {}^1B_1'\varsigma_u\sqrt{2} - {}^1B'\varsigma_u\sqrt{2} - {}^1g_{13}'\upsilon_u\sqrt{2} - {}^1g_3'\upsilon_u\sqrt{2} +$$
$$L_u g_{13}'\eta_u\sqrt{2} - {}^1L_u g_3'\eta_u\sqrt{2} - {}^1L_u g_{13}'\varsigma_u\sqrt{2} - {}^1L_u g_3'\varsigma_u\sqrt{2}$$

$$U_1 \triangleq U(\theta = 0) = a + B'\eta_u + B_1'\varsigma_u + B_3'\mu_u +$$
$$2g_{11}'\xi_u + g_{13}'\upsilon_u + 2g_1'\chi_u + L_u g_3'\eta_u + L_u g_{13}'\varsigma_u + L_u g_{33}'\mu_u$$

$$U_3 \triangleq U(\theta = \pi/2) = a - B_1'\eta_u + B'\varsigma_u + B_3'\mu_u -$$
$$2g_1'\chi_u + g_3'\upsilon_u + 2g'\xi_u - L_u g_{13}'\eta_u + L_u g_3'\varsigma_u + L_u g_{33}'\mu_u$$

$$U_5 \triangleq U(\theta = \pi) = a - B'\eta_u - B_1'\varsigma_u + B_3'\mu_u +$$
$$2g_{11}'\xi_u - g_{13}'\upsilon_u + 2g_1'\chi_u - L_u g_3'\eta_u - L_u g_{13}'\varsigma_u + L_u g_{33}'\mu_u$$

$$U_7 \triangleq U(\theta = 3\pi/2) = a + B_1'\eta_u - B'\varsigma_u + B_3'\mu_u -$$
$$2g_1'\chi_u - g_3'\upsilon_u + 2g'\xi_u + L_u g_{13}'\eta_u - L_u g_3'\varsigma_u + L_u g_{33}'\mu_u$$

Note that even with all of these misalignment errors considered the following L.C. vanishes if the SQUID stays in lock throughout the measurement series:

$$U_0 - U_1 + U - U_3 + U_4 - U_5 + U_6 - U_7 = 0 \tag{74}$$

So this is still a good check to test the SQUID lock and the integrity of the data with respect to random pointing errors which might occur during the measurement sequence.

A. Solving for Gradient Components.

Assuming that $\xi_u, \chi_u, \varsigma_u, \eta_u, \upsilon_u, \mu_u$ are all known by calibration, the 8 equations in 73 contain 10 unknown independent variables, namely $B_x', B_y', B_z', g_{xx}', g_{yy}', g_{zz}', g_{xy}', g_{yz}', g_{zx}', a$, since voltages $U_0 \ldots U_7$ are determined by measurement. The set of equations in 73 is clearly underdetermined and additional data from the other two drums is necessary to determine a complete solution. Nevertheless it is possible to solve for the off-diagonal gradient component, $g_{xy}'$, and the difference between the diagonal components, $g_{xx}' - g_{yy}'$, independently of the measurements from the other two drums. This is done by forming the following linear combinations of eqs. 73 to eliminate the dependence on the SQUID offset voltage $a$ and on the field components, $$U_0 - U + U_4 - U_6 = 4\chi_u \Delta' - 8\xi_u g_{xy}' \tag{75}$$

$$U_1 - U_3 + U_5 - U_7 = 4\xi_u \Delta' + 8\chi_u g_{xy}', \tag{76}$$

where $$\Delta' \triangleq g_{xx}' - g_{yy}'$$

Then $$\begin{pmatrix} g_{xy}' \\ \Delta' \end{pmatrix} = \begin{pmatrix} \dfrac{\chi_u(U_1 - U_3 + U_5 - U_7) - \xi_u(U_0 - U + U_4 - U_6)}{8(\xi_u + \chi_u)} \\ \dfrac{\chi_u(U_0 - U + U_4 - U_6) + \xi_u(U_1 - U_3 + U_5 - U_7)}{4(\xi_u + \chi_u)} \end{pmatrix} \tag{77}$$

provided $$(\xi_u + \chi_u) \neq 0 \tag{78}$$

which is always satisfied because both $\xi_u$ and $\chi_u$ are real and $\xi_u > 0$.

The results from these additional gradiometers give solutions with exactly the same form in their respective coordinate systems, i.e.

$$\begin{pmatrix} g_{xy}'' \\ \Delta'' \end{pmatrix} = \begin{pmatrix} \dfrac{\chi_v(V_1 - V_3 + V_5 - V_7) - \xi_v(V_0 - V + V_4 - V_6)}{8(\xi_v + \chi_v)} \\ \dfrac{\chi_v(V_0 - V + V_4 - V_6) + \xi_v(V_1 - V_3 + V_5 - V_7)}{4(\xi_v + \chi_v)} \end{pmatrix} \tag{79}$$

and $$\begin{pmatrix} g_{xy}''' \\ \Delta''' \end{pmatrix} = \begin{pmatrix} \dfrac{\chi_w(W_1 - W_3 + W_5 - W_7) - \xi_w(W_0 - W + W_4 - W_6)}{8(\xi_w + \chi_w)} \\ \dfrac{\chi_w(W_0 - W + W_4 - W_6) + \xi_w(W_1 - W_3 + W_5 - W_7)}{4(\xi_w + \chi_w)} \end{pmatrix} \tag{80}$$

Equations 77, 79 and 80 are now transformed to the instrument coordinate system and the resulting system of equations may be solved to yield the gradient measurements.

1. Transformations for the "Proof of Concept" Instrument.

In the case of the present embodiment $\lambda = \pi/4$, and the transformations for the xy, xx and yy gradient components of the C', C" and C"' coordinate systems are those given by the relevant equations in 36, 37 and 44, which are brought together here for convenience:

$$\left.\begin{array}{l}g'_1 = \frac{1}{\sqrt{2}}(g_1 - g_3)\\g''_1 = -\frac{1}{4}\sqrt{2}\,g_1 + \frac{1}{4}\sqrt{2}\,g_3 + \frac{1}{8}\sqrt{6}\,g_{11} + \frac{1}{4}\sqrt{6}\,g_{13} - \frac{1}{8}\sqrt{6}\,g\\g'''_1 = -\frac{1}{4}\sqrt{2}\,g_1 + \frac{1}{4}\sqrt{2}\,g_3 - \frac{1}{8}\sqrt{6}\,g_{11} - \frac{1}{4}\sqrt{6}\,g_{13} + \frac{1}{8}\sqrt{6}\,g\\g'_{11} = \frac{1}{4}g_{11} - g_{13} + \frac{1}{4}g_{33}\\g' = g\\g''_{11} = \frac{1}{8}g_{11} + \frac{1}{4}g_{13} + \frac{3}{8}g + \frac{1}{4}g_{33} - \frac{1}{4}\sqrt{3}\,g_1 - \frac{1}{\sqrt{3}}g_3\\g'' = \frac{3}{4}g_{11} + \frac{1}{4}g + \frac{1}{4}g_1\sqrt{3}\\g'''_{11} = \frac{1}{8}g_{11} + \frac{1}{4}g_{13} + \frac{3}{8}g + \frac{1}{4}g_{33} + \frac{1}{4}\sqrt{3}\,g_1 + \frac{1}{\sqrt{3}}g_3\\g''' = \frac{3}{4}g_{11} + \frac{1}{4}g - \frac{1}{\sqrt{3}}g_1\end{array}\right\} \quad (81)$$

Using the last six of these equations we can derive the transformation equations for the diagonal component differences $\Delta'$, $\Delta''$ and $\Delta'''$, i.e.

$$\begin{aligned}\Delta' &= g'_{11} - g' \quad (82)\\&= \frac{1}{2}g_{11} - g_{13} - g + \frac{1}{2}g_{33}\\&= \frac{1}{2}\Delta_1 - \frac{1}{2}\Delta - g_{13}\\\Delta'' &= g''_{11} - g'' \quad (83)\\&= -\frac{5}{8}g_{11} + \frac{1}{8}g + \frac{1}{2}g_{33} - \frac{3}{4}g_1\sqrt{3} - \frac{1}{2}g_3\sqrt{3} + \frac{1}{2}g_{13}\\&= -\frac{1}{8}\Delta_1 + \frac{1}{2}\Delta_3 - \frac{3}{4}g_1\sqrt{3} - \frac{1}{2}g_3\sqrt{3} + \frac{1}{2}g_{13}\\\Delta''' &= g'''_{11} - g''' \quad (84)\\&= -\frac{5}{8}g_{11} + \frac{1}{8}g + \frac{1}{2}g_{33} + \frac{3}{4}g_1\sqrt{3} + \frac{1}{2}g_3\sqrt{3} + \frac{1}{2}g_{13}\\&= -\frac{1}{8}\Delta_1 + \frac{1}{2}\Delta_3 + \frac{3}{4}g_1\sqrt{3} + \frac{1}{2}g_3\sqrt{3} + \frac{1}{2}g_{13}\end{aligned}$$

where $$\left.\begin{array}{l}\Delta_1 \triangleq g_{11} - g\\ \Delta \triangleq g - g_{33}\\ \Delta_3 \triangleq g_{33} - g_{11}\end{array}\right\} \quad (85)$$

Combining these with the first three equation of 81 yields the following set of equations $$\left.\begin{array}{l}g'_1 = \frac{1}{\sqrt{2}}g_1 - \frac{1}{\sqrt{2}}g_3\\g''_1 = -\frac{1}{4}\sqrt{2}\,g_1 + \frac{1}{4}\sqrt{2}\,g_3 + \frac{1}{4}\sqrt{6}\,g_{13} + \frac{1}{8}\sqrt{6}\,\Delta_1\\g'''_1 = -\frac{1}{4}\sqrt{2}\,g_1 + \frac{1}{4}\sqrt{2}\,g_3 - \frac{1}{4}\sqrt{6}\,g_{13} - \frac{1}{8}\sqrt{6}\,\Delta_1\\\Delta' = \frac{1}{2}\Delta_1 - \frac{1}{2}\Delta - g_{13}\\\Delta'' = -\frac{1}{8}\Delta_1 + \frac{1}{2}\Delta_3 - \frac{3}{4}\sqrt{3}\,g_1 - \frac{1}{\sqrt{3}}g_3 + \frac{1}{2}g_{13}\\\Delta''' = -\frac{1}{8}\Delta_1 + \frac{1}{2}\Delta_3 - \frac{3}{4}\sqrt{3}\,g_1 + \frac{1}{\sqrt{3}}g_3 + \frac{1}{2}g_{13}\end{array}\right\} \quad (86)$$

Although the corresponding matrix of coefficients, with respect to the variables $g_1$, $g_3$, $g_{13}$, $\Delta_1$, $\Delta$, $\Delta_3$, $$\begin{pmatrix}-\frac{1}{\sqrt{2}} & \frac{1}{\sqrt{2}} & 0 & 0 & 0 & 0\\\frac{1}{4}\sqrt{2} & -\frac{1}{4}\sqrt{2} & -\frac{1}{4}\sqrt{6} & -\frac{1}{8}\sqrt{6} & 0 & 0\\\frac{1}{4}\sqrt{2} & -\frac{1}{4}\sqrt{2} & \frac{1}{4}\sqrt{6} & \frac{1}{8}\sqrt{6} & 0 & 0\\0 & 0 & 1 & -\frac{1}{2} & \frac{1}{2} & 0\\\frac{3}{4}\sqrt{3} & \frac{1}{\sqrt{3}} & -\frac{1}{2} & \frac{1}{8} & 0 & -\frac{1}{2}\\-\frac{3}{4}\sqrt{3} & -\frac{1}{\sqrt{3}} & -\frac{1}{2} & \frac{1}{8} & 0 & -\frac{1}{2}\end{pmatrix}\begin{pmatrix}g_1\\g_3\\g_{13}\\\Delta_1\\\Delta\\\Delta_3\end{pmatrix} = \begin{pmatrix}-g'_1\\-g''_1\\-g'''_1\\-\Delta'\\-\Delta''\\-\Delta'''\end{pmatrix}$$

is singular a solution can by obtained after observing that, by definition, $$\Delta_1 + \Delta + \Delta_3 = g_{11} - g + g - g_{33} + g_{33} - g_{11} = 0$$

and use this equation to augment 86, i.e.

$$\left.\begin{array}{l}g'_1 = \frac{1}{\sqrt{2}}g_1 - \frac{1}{\sqrt{2}}g_3\\g''_1 = -\frac{1}{4}\sqrt{2}\,g_1 + \frac{1}{4}\sqrt{2}\,g_3 + \frac{1}{4}\sqrt{6}\,g_{13} + \frac{1}{8}\sqrt{6}\,\Delta_1\\g'''_1 = -\frac{1}{4}\sqrt{2}\,g_1 + \frac{1}{4}\sqrt{2}\,g_3 - \frac{1}{4}\sqrt{6}\,g_{13} - \frac{1}{8}\sqrt{6}\,\Delta_1\\\Delta' = \frac{1}{2}\Delta_1 - \frac{1}{2}\Delta - g_{13}\\\Delta'' = -\frac{1}{8}\Delta_1 + \frac{1}{2}\Delta_3 - \frac{3}{4}\sqrt{3}\,g_1 - \frac{1}{\sqrt{3}}g_3 + \frac{1}{2}g_{13}\\\Delta''' = -\frac{1}{8}\Delta_1 + \frac{1}{2}\Delta_3 - \frac{3}{4}\sqrt{3}\,g_1 + \frac{1}{\sqrt{3}}g_3 + \frac{1}{2}g_{13}\\0 = \Delta_1 + \Delta + \Delta_3\end{array}\right\}$$

The corresponding matrix form $$\begin{pmatrix} -\frac{1}{\sqrt{2}} & \frac{1}{\sqrt{2}} & 0 & 0 & 0 & 0 \\ \frac{1}{4}\sqrt{2} & -\frac{1}{4}\sqrt{2} & -\frac{1}{4}\sqrt{6} & -\frac{1}{8}\sqrt{6} & 0 & 0 \\ \frac{1}{4}\sqrt{2} & -\frac{1}{4}\sqrt{2} & \frac{1}{4}\sqrt{6} & \frac{1}{8}\sqrt{6} & 0 & 0 \\ 0 & 0 & 1 & -1 & 1 & 0 \\ \frac{3}{4}\sqrt{3} & \frac{1}{\sqrt{3}} & -1 & \frac{1}{8} & 0 & -1 \\ -\frac{3}{4}\sqrt{3} & -\frac{1}{\sqrt{3}} & -1 & \frac{1}{8} & 0 & -1 \\ 0 & 0 & 0 & -1 & -1 & -1 \end{pmatrix} \begin{pmatrix} g_1 \\ g_3 \\ g_{13} \\ \Delta_1 \\ \Delta \\ \Delta_3 \end{pmatrix} = \begin{pmatrix} -g_1' \\ -g_1'' \\ -g_1''' \\ -\Delta' \\ -\Delta'' \\ -\Delta''' \\ 0 \end{pmatrix}$$

is transformed to a square matrix by multiplying on the left by the transpose of the coefficient matrix to give $$\begin{pmatrix} \frac{33}{8} & 3 & 0 & 0 & 0 & 0 \\ 3 & \frac{9}{4} & 0 & 0 & 0 & 0 \\ 0 & 0 & \frac{9}{4} & -\frac{1}{4} & 1 & 1 \\ 0 & 0 & -\frac{1}{4} & \frac{47}{3} & \frac{3}{4} & \frac{7}{8} \\ 0 & 0 & 1 & \frac{3}{4} & \frac{5}{4} & 1 \\ 0 & 0 & 1 & \frac{7}{8} & 1 & 3 \end{pmatrix} \begin{pmatrix} g_1 \\ g_3 \\ g_{13} \\ \Delta_1 \\ \Delta \\ \Delta_3 \end{pmatrix} =$$

$$\begin{pmatrix} \frac{1}{4}g_1'\sqrt{2} - \frac{1}{4}g_1''\sqrt{2} - \frac{3}{4}\Delta''\sqrt{3} - \frac{1}{4}g_1'''\sqrt{2} + \frac{3}{4}\Delta'''\sqrt{3} \\ -\frac{1}{4}g_1'\sqrt{2} + \frac{1}{4}g_1''\sqrt{2} - \frac{1}{4}\Delta''\sqrt{3} + \frac{1}{4}g_1'''\sqrt{2} + \frac{1}{4}\Delta'''\sqrt{3} \\ -\Delta' + \frac{1}{4}\Delta'' + \frac{1}{4}\Delta''' + \frac{1}{4}g_1''\sqrt{6} - \frac{1}{4}g_1'''\sqrt{6} \\ \frac{1}{4}\Delta' - \frac{1}{8}\Delta'' - \frac{1}{8}\Delta''' + \frac{1}{8}g_1''\sqrt{6} - \frac{1}{8}g_1'''\sqrt{6} \\ -\frac{1}{4}\Delta' \\ \frac{1}{4}\Delta'' + \frac{1}{4}\Delta''' \end{pmatrix}$$

which is now non-singular. The inverse of the coefficient matrix is $$\begin{pmatrix} \frac{8}{5} & -\frac{16}{75} & 0 & 0 & 0 & 0 \\ -\frac{16}{75} & \frac{44}{75} & 0 & 0 & 0 & 0 \\ 0 & 0 & \frac{136}{5} & \frac{88}{5} & -\frac{64}{5} & -\frac{6}{5} \\ 0 & 0 & \frac{88}{5} & \frac{304}{5} & -\frac{11}{5} & -\frac{44}{75} \\ 0 & 0 & -\frac{64}{5} & -\frac{11}{5} & \frac{436}{5} & \frac{68}{75} \\ 0 & 0 & -\frac{6}{5} & -\frac{44}{75} & \frac{68}{75} & \frac{17}{75} \end{pmatrix}$$

and the solution of the system of equations, 86, is $$\begin{pmatrix} g_1 \\ g_3 \\ g_{13} \\ \Delta_1 \\ \Delta \\ \Delta_3 \end{pmatrix} = \begin{pmatrix} \frac{\sqrt{3}}{15}(\Delta''' - \Delta'') + \frac{\sqrt{}}{15}(2g_1' - g_1'' - g_1''') \\ \frac{\sqrt{3}}{15}(\Delta''' - \Delta'') + \frac{\sqrt{}}{5}(g_1'' - 2g_1' + g_1''') \\ \overline{15}(\Delta'' - 2\Delta' + \Delta''') + \frac{\sqrt{6}}{5}(g_1'' - g_1''') \\ \frac{8}{15}\Delta' - \frac{4}{15}\Delta'' - \frac{4}{15}\Delta''' + \frac{4}{15}g_1''\sqrt{6} - \frac{4}{15}g_1'''\sqrt{6} \\ -\frac{14}{15}\Delta' - \frac{8}{15}\Delta'' - \frac{8}{15}\Delta''' - \overline{15}g_1''\sqrt{6} + \overline{15}g_1'''\sqrt{6} \\ 5\Delta' + \frac{4}{5}\Delta'' + \frac{4}{5}\Delta''' - \overline{15}g_1''\sqrt{6} + \overline{15}g_1'''\sqrt{6} \end{pmatrix} \quad (87)$$

Note that at this point this solution has been obtained without using the tracelessness of the gradient tensor and is written in terms of the differences between the diagonal components. The diagonal components, however, follow immediately from equations 85 and the traceless of the gradient tensor, i.e. given that $$\left.\begin{array}{l} g_{11} - g = \Delta_1 \\ g - g_{33} = \Delta \\ g_{33} - g_{11} = \Delta_3 \\ g_{11} + g + g_{33} = 0 \end{array}\right\} \Rightarrow \begin{pmatrix} 1 & -1 & 0 \\ 0 & 1 & -1 \\ -1 & 0 & 1 \\ 1 & 1 & 1 \end{pmatrix} \begin{pmatrix} g_{11} \\ g \\ g_{33} \end{pmatrix} = \begin{pmatrix} \Delta_1 \\ \Delta \\ \Delta_3 \\ 0 \end{pmatrix} \quad (88)$$

then $$\begin{pmatrix} g_{11} \\ g \\ g_{33} \end{pmatrix} = \frac{1}{3}\begin{pmatrix} -\Delta_3 + \Delta_1 \\ -\Delta_1 + \Delta \\ -\Delta + \Delta_3 \end{pmatrix} \quad (89)$$

Substituting for the component differences from the last three equations in 87 gives $$\begin{pmatrix} g_{11} \\ g \\ g_{33} \end{pmatrix} = \begin{pmatrix} -\overline{45}(-\Delta' + 8\Delta'' + 8\Delta''') + \frac{\sqrt{6}}{15}(g_1'' - g_1''') \\ -\overline{45}(11\Delta' + 2\Delta'' + 2\Delta''') + \frac{\sqrt{6}}{15}(g_1''' - g_1'') \\ \frac{4}{9}(\Delta' + \Delta'' + \Delta''') \end{pmatrix} \quad (90)$$

The final solution for the gradient components follow after substituting for the Δ's and g's from equations 77, 79 and 80 into equation 90 and the first three equations of 87. The resulting equations are brought together here for convenience.

$$g_{11} = -\overline{45}(-\Delta' + 8\Delta'' + 8\Delta''') + \frac{\sqrt{6}}{15}(g_1'' - g_1''') \tag{91}$$

$$g = -\overline{45}(11\Delta' + 2\Delta'' + 2\Delta''') + \frac{\sqrt{6}}{15}(g_1''' - g_1'')$$

$$g_{33} = \frac{4}{9}(\Delta' + \Delta'' + \Delta''')$$

$$g_1 = \frac{\sqrt{3}}{15}(\Delta''' - \Delta'') + \frac{\sqrt{}}{15}(2g_1' - g_1'' - g_1''')$$

$$g_3 = \frac{\sqrt{3}}{15}(\Delta''' - \Delta'') + \frac{\sqrt{}}{5}(g_1'' - 2g_1' + g_1''')$$

$$g_{13} = \overline{15}(\Delta'' - 2\Delta' + \Delta''') + \frac{\sqrt{6}}{5}(g_1'' - g_1''')$$

in which $$g_1' = \frac{\chi_u(U_1 - U_3 + U_5 - U_7) - \xi_u(U_0 - U + U_4 - U_6)}{8(\xi_u + \chi_u)}$$

$$g_1'' = \frac{\chi_v(V_1 - V_3 + V_5 - V_7) - \xi_v(V_0 - V + V_4 - V_6)}{8(\xi_v + \chi_v)}$$

$$g_1''' = \frac{\chi_w(W_1 - W_3 + W_5 - W_7) - \xi_w(W_0 - W + W_4 - W_6)}{8(\xi_w + \chi_w)}$$

$$\Delta' = \frac{\chi_u(U_0 - U + U_4 - U_6) + \xi_u(U_1 - U_3 + U_5 - U_7)}{4(\xi_u + \chi_u)}$$

$$\Delta'' = \frac{\chi_v(V_0 - V + V_4 - V_6) + \xi_v(V_1 - V_3 + V_5 - V_7)}{4(\xi_v + \chi_v)}$$

$$\Delta''' = \frac{\chi_w(W_0 - W + W_4 - W_6) + \xi_w(W_1 - W_3 + W_5 - W_7)}{4(\xi_w + \chi_w)}$$

and $$\xi_u \stackrel{\Delta}{=} {}^1\rho(M_1\cos\sigma_1 + M \cos\sigma)$$

$$\chi_u \stackrel{\Delta}{=} {}^1\rho(M_1\sin\sigma_1 + M \sin\sigma)$$

$$M_1 \stackrel{\Delta}{=} S_1\cos\tau_1, N_1 \stackrel{\Delta}{=} S_1 \sin\tau_1$$

$$M \stackrel{\Delta}{=} S \cos\tau, N \stackrel{\Delta}{=} S \sin\tau$$

2. Special Case: "Proof of Concept Instrument" with Zero Alignment Errors.

If all of the alignment errors vanish then $$\xi_u = {}^1\rho(S_1 + S)$$

$$\chi_u = 0$$

and equation 91 reduces to $$g_{11} = -\overline{45}(-\Delta' + 8\Delta'' + 8\Delta''') + \frac{\sqrt{6}}{15}(g_1'' - g_1''') \tag{92}$$

$$g = -\overline{45}(11\Delta' + 2\Delta'' + 2\Delta''') + \frac{\sqrt{6}}{15}(g_1''' - g_1'')$$

$$g_{33} = \frac{4}{9}(\Delta' + \Delta'' + \Delta''')$$

$$g_1 = \frac{\sqrt{3}}{15}(\Delta''' - \Delta'') + \frac{\sqrt{}}{15}(2g_1' - g_1'' - g_1''')$$

$$g_3 = \frac{\sqrt{3}}{15}(\Delta''' - \Delta'') + \frac{\sqrt{}}{5}(g_1'' - 2g_1' + g_1''')$$

$$g_{13} = \overline{15}(\Delta'' - 2\Delta' + \Delta''') + \frac{\sqrt{6}}{5}(g_1'' - g_1''')$$

and $$g_1' = \frac{-(U_0 - U + U_4 - U_6)}{8\xi_u}$$

$$g_1'' = \frac{-(V_0 - V + V_4 - V_6)}{8\xi_v}$$

$$g_1''' = \frac{-(W_0 - W + W_4 - W_6)}{8\xi_w}$$

$$\Delta' = \frac{(U_1 - U_3 + U_5 - U_7)}{4\xi_u}$$

$$\Delta'' = \frac{(V_1 - V_3 + V_5 - V_7)}{4\xi_v}$$

$$\Delta''' = \frac{(W_1 - W_3 + W_5 - W_7)}{4\xi_w}$$

IV. Solving for Field Components.

If the gradiometer is intentionally unbalanced, i.e. $S_1 \neq S$ then it is capable of returning information about the magnetic field in addition to the gradient. As for the gradient case considered above we form linear combinations of 73 to both eliminate the dependence on the SQUID offset voltage, $a_1$ and to reduce the number of gradient terms. To eliminate the SQUID offset we start with the differences between voltages corresponding to opposing positions, and then take the sums and differences of these pairs, i.e.

$(U_0-U_4)+(U-U_6)=2\eta_u B'\sqrt{2}+2\varsigma_u B'_1\sqrt{2}+2\nu_u g'_{13}$
$\sqrt{2}+2L_u\eta_u g'_3\sqrt{2}+2L_u\varsigma_u g'_{13}\sqrt{2}$ $(U_0-U_4)-(U-U_6)=2\eta_u B'_1\sqrt{2}+2\varsigma_u B'\sqrt{2}+2\nu_u g'_3$
$\sqrt{2}+2L_u\eta_u g'_{13}\sqrt{2}+2L_u\varsigma_u g'_3\sqrt{2}$ $(U_1-U_5)+(U_3-U_7)=2B'\eta_u-2B'_1\eta_u+2B'_1\varsigma_u+2B'\varsigma_u+$
$2g'_{13}\nu_u+2g'_3\nu_u-2L_u g'_{13}\eta_u+2L_u g'_3\eta_u+2L_u g'_{13}\varsigma_u+$
$2L_u g'_3\varsigma_u$ $(U_1-U_5)-(U_3-U_7)=2B'_1\eta_u+2\eta_u\eta_u+2B'_1\varsigma_u-2B'\varsigma_u+$
$2g'_{13}\nu_u-2g'_3\nu_u+2L_u g'_{13}\eta_u+2L_u g'_3\eta_u 2L_u g'_{13}\varsigma_u-$
$2L_u g'_3\varsigma_u$ and then simplify further by forming the following L.C. of these equations:

$$\frac{U_1 + U_3 - U_5 - U_7}{2} - \frac{U_0 + U - U_4 - U_6}{2\sqrt{2}} = \tag{3}$$

$$\varsigma_u B' - \eta_u B'_1 + \nu_u g'_3 - L_u \eta_u g'_{13} + L_u \varsigma_u g'_3$$

-continued $$\frac{U_1 - U_3 - U_5 + U_7}{2} - \frac{U_0 - U - U_4 + U_6}{2\sqrt{2}} = \quad (94)$$
$$\eta_u B' + \varsigma_u B'_1 + \upsilon_u g'_{13} + L_u \eta_u g'_3 + L_u \varsigma_u g'_{13}$$

As for the gradient calculation previously the results from the other two drums have exactly the same form in their respective coordinate systems, i.e.

$$\frac{V_1 + V_3 - V_5 - V_7}{2} - \frac{V_0 + V - V_4 - V_6}{2\sqrt{2}} = \quad (95)$$
$$\varsigma_v B'' - \eta_v B''_1 + \upsilon_v g''_3 - L_v \eta_v g''_{13} + L_v \varsigma_v g''_3$$

$$\frac{V_1 - V_3 - V_5 + V_7}{2} - \frac{V_0 - V - V_4 + V_6}{2\sqrt{2}} = \quad (96)$$
$$\eta_v B'' + \varsigma_v B''_1 + \upsilon_v g''_{13} + L_v \eta_v g''_3 + L_v \varsigma_v g''_{13}$$

$$\frac{W_1 + W_3 - W_5 - W_7}{2} - \frac{W_0 + W - W_4 - W_6}{2\sqrt{2}} = \quad (97)$$
$$\varsigma_w B''' - \eta_w B'''_1 + \upsilon_w g'''_3 - L_w \eta_w g'''_{13} + L_w \varsigma_w g'''_3$$

$$\frac{W_1 - W_3 - W_5 + W_7}{2} - \frac{W_0 - W - W_4 + W_6}{2\sqrt{2}} = \quad (98)$$
$$\eta_w B''' - \varsigma_w B'''_1 + \upsilon_w g'''_3 + L_w \eta_w g'''_3 + L_w \varsigma_w g'''_{13}$$

Equations 93-?? may be simplified by making the following substitutions:

$$\begin{aligned}
U^\dagger &\triangleq \frac{U_1 + U_3 - U_5 - U_7}{2} - \frac{U_0 + U - U_4 - U_6}{2\sqrt{2}} - g'_3(L_u \varsigma_u + \upsilon_u) + L_u g'_{13} \eta_u \\
U^\ddagger &\triangleq \frac{U_1 + U_3 - U_5 + U_7}{2} - \frac{U_0 - U - U_4 + U_6}{2\sqrt{2}} - g'_{13}(L_u \varsigma_u + \upsilon_u) + L_u g'_3 \eta_u \\
V^\dagger &\triangleq \frac{V_1 + V_3 - V_5 - V_7}{2} - \frac{V_0 + V - V_4 - V_6}{2\sqrt{2}} - L_u g''_{13} \eta_u - g''_3 \upsilon_v - L_v g'_3 \eta_u \\
V^\ddagger &\triangleq \frac{V_1 - V_3 - V_5 + V_7}{2} - \frac{V_0 - V - V_4 + V_6}{2\sqrt{2}} - g''_{13} \upsilon_v - L_v g''_3 \eta_v - L_v g''_{13} \varsigma_v \\
W^\dagger &\triangleq \frac{W_1 + W_3 - W_5 - W_7}{2} - \frac{W_0 + W - W_4 - W_6}{2\sqrt{2}} - L_w g'''_{13} \eta_w - g'''_3 \upsilon_w - L_w g'''_3 \varsigma_w \\
W^\ddagger &\triangleq \frac{W_1 - W_3 - W_5 + W_7}{2} - \frac{W_0 - W - W_4 + W_6}{2\sqrt{2}} - g'''_3 \upsilon_w - L_w g'''_3 \eta_w - L_w g'''_{13} \varsigma_w
\end{aligned} \quad (99)$$

Observe that all of the terms on the right hand sides of these equations are known i.e. the U, V and W voltages are returned by instrument, the gradient components axe known in the instrument frame and can be easily found using coordinare transformations, and the remaining terms are known by calibration. With these substitutions 93-?? become $$\begin{aligned}
U^\dagger &= \varsigma_u B' - \eta_u B'_1 \\
U^\ddagger &= \eta_u B' + \varsigma_u B'_1 \\
V^\dagger &= \varsigma_v B'' - \eta_v B''_1 \\
V^\ddagger &= \eta_v B'' + \varsigma_v B''_1 \\
W^\dagger &= \varsigma_w B''' - \eta_w B'''_1 \\
W^\ddagger &= \eta_w B''' + \varsigma_w B'''_1
\end{aligned} \quad (100)$$

Equations 100, corresponding to measurements in the C', C" and C'" coordinate systems, may be solved by transforming to the common instrument coordinate system using the coordinate transformations for field components derived earlier, but the resulting sets of equations rapidly become intractable. It is simpler to first solve these pairwise in their respective coordinate systems, $$\begin{pmatrix} B'_1 \\ B' \end{pmatrix} = \frac{1}{\eta_u + \varsigma_u} \begin{pmatrix} U^\ddagger_{\varsigma_u} - U^\dagger_{\eta_u} \\ U^\ddagger_{\eta_u} + U^\dagger_{\varsigma_u} \end{pmatrix} \quad (101)$$

$$\begin{pmatrix} B''_1 \\ B'' \end{pmatrix} = \frac{1}{\eta_v + \varsigma_v} \begin{pmatrix} V^\ddagger_{\varsigma_v} - V^\dagger_{\eta_v} \\ V^\ddagger_{\eta_v} + V^\dagger_{\varsigma_v} \end{pmatrix} \quad (102)$$

$$\begin{pmatrix} B'''_1 \\ B''' \end{pmatrix} = \frac{1}{\eta_\omega + \varsigma_\omega} \begin{pmatrix} W^\ddagger_{\varsigma_\omega} - W^\dagger_{\eta_\omega} \\ W^\ddagger_{\eta_\omega} + W^\dagger_{\varsigma_\omega} \end{pmatrix} \quad (103)$$

and then carry out the transformation to the instrument system. As derived above the relevant, transformation equations for the field components are $$B' = \begin{pmatrix} \sin\lambda & 0 & -\cos\lambda \\ 0 & 1 & 0 \\ \cos\lambda & 0 & \sin\lambda \end{pmatrix} B \Rightarrow \begin{cases} B'_1 = -(\cos\lambda) B_3 + (\sin\lambda) B_1 \\ B' = B \\ B'_3 = (\cos\lambda) B_1 + (\sin\lambda) B_3 \end{cases}$$

-continued $$B'' = \begin{pmatrix} -\tfrac{1}{2}\sin\lambda & \tfrac{1}{2}\sqrt{3}(\sin\lambda) & -\cos\lambda \\ -\tfrac{1}{2}\sqrt{3} & -\tfrac{1}{2} & 0 \\ -\tfrac{1}{2}\cos\lambda & \tfrac{1}{2}\sqrt{3}(\cos\lambda) & \sin\lambda \end{pmatrix} B \Rightarrow$$

$$\begin{cases} B''_1 = -(\cos\lambda) B_3 - \tfrac{1}{2}(\sin\lambda) B_1 + \tfrac{1}{2}(\sin\lambda) B \sqrt{3} \\ B'' = -\tfrac{1}{2} B - \tfrac{1}{2} B_1 \sqrt{3} \\ B''_3 = -\tfrac{1}{2}(\cos\lambda) B_1 + (\sin\lambda) B_3 + \tfrac{1}{2}(\cos\lambda) B \sqrt{3} \end{cases}$$

$$B''' = \begin{pmatrix} -\tfrac{1}{2}\sin\lambda & -\tfrac{1}{2}\sqrt{3}(\sin\lambda) & -\cos\lambda \\ \tfrac{1}{2}\sqrt{3} & -\tfrac{1}{2} & 0 \\ -\tfrac{1}{2}\cos\lambda & -\tfrac{1}{2}\sqrt{3}(\cos\lambda) & \sin\lambda \end{pmatrix} B \Rightarrow$$

-continued $$\begin{cases} B_1''' = -(\cos\lambda) B_3 - {}^1(\sin\lambda) B_1 - {}^1(\sin\lambda) B\sqrt{3} \\ B''' = -{}^1 B + {}^1 B_1 \sqrt{3} \\ B_3''' = -{}^1(\cos\lambda) B_1 + (\sin\lambda) B_3 - {}^1(\cos\lambda) B\sqrt{3} \end{cases}$$

and if $\lambda = \pi/4$ $$\begin{cases} B_1' = {}^1\sqrt{2}(B_1 - B_3) \\ B' = B \\ B_1'' = \frac{1}{4}\sqrt{2}(-B_1 + \sqrt{3} B - 2B_3) \\ B'' = -{}^1(B_1\sqrt{3} + B) \\ B_1''' = \frac{1}{4}\sqrt{2}(-B_1 - \sqrt{3} B - 2B_3) \\ B''' = {}^1(\sqrt{3} B_1 - B) \end{cases} \quad (104)$$

and equations 101-103 become $$\begin{cases} \dfrac{U_{S_u}^\ddagger - U_{\eta_u}^\dagger}{\eta_u + S_u} = {}^1\sqrt{2}(B_1 - B_3) \\ \dfrac{U_{\eta_u}^\ddagger + U_{S_u}^\dagger}{\eta_u + S_u} = B \\ \dfrac{V_{S_v}^\ddagger - V_{\eta_v}^\dagger}{\eta_v + S_v} = \dfrac{1}{4}\sqrt{2}(-B_1 + \sqrt{3} B - 2B_3) \\ \dfrac{V_{\eta_v}^\ddagger - V_{S_v}^\dagger}{\eta_v + S_v} = -{}^1(B_1\sqrt{3} + B) \\ \dfrac{W_{S_\omega}^\ddagger - W_{\eta_\omega}^\dagger}{\eta_\omega + S_\omega} = \dfrac{1}{4}\sqrt{2}(-B_1 - \sqrt{3} B - 2B_3) \\ \dfrac{W_{\eta_\omega}^\ddagger - W_{S_\omega}^\dagger}{\eta_\omega + S_\omega} = {}^1(\sqrt{3} B_1 - B) \end{cases} \quad (105)$$

A least-squares best-fit solution may be found by first rewriting this overdetermined system of equations in matrix form in terms of the unknowns $B_1$, $B$, $B_3$ to give $$\begin{pmatrix} {}^1\sqrt{2} & 0 & -{}^1\sqrt{2} \\ 0 & 1 & 0 \\ -\frac{1}{4}\sqrt{2} & \frac{1}{4}\sqrt{6} & -{}^1\sqrt{2} \\ -{}^1\sqrt{3} & -{}^1 & 0 \\ -\frac{1}{4}\sqrt{2} & -\frac{1}{4}\sqrt{6} & -{}^1\sqrt{2} \\ {}^1\sqrt{3} & -{}^1 & 0 \end{pmatrix} \begin{pmatrix} B_1 \\ B \\ B_3 \end{pmatrix} = \begin{pmatrix} \dfrac{U_{S_u}^\ddagger - U_{\eta_u}^\dagger}{\eta_u + S_u} \\ \dfrac{U_{\eta_u}^\ddagger + U_{S_u}^\dagger}{\eta_u + S_u} \\ \dfrac{V_{S_v}^\ddagger - V_{\eta_v}^\dagger}{\eta_v + S_v} \\ \dfrac{V_{\eta_v}^\ddagger - V_{S_v}^\dagger}{\eta_v + S_v} \\ \dfrac{W_{S_\omega}^\ddagger - W_{\eta_\omega}^\dagger}{\eta_\omega + S_\omega} \\ \dfrac{W_{\eta_\omega}^\ddagger - W_{S_\omega}^\dagger}{\eta_\omega + S_\omega} \end{pmatrix}$$

and then multiplying on the left by the transpose of the coefficient matrix to yield $$\begin{pmatrix} \frac{9}{4}B_1 \\ \frac{9}{4}B \\ \frac{3}{2}B_3 \end{pmatrix} = \begin{pmatrix} -\frac{1}{2}\sqrt{3}\dfrac{V_{\eta_v}^\ddagger + V_{S_v}^\dagger}{\eta_v + S_v} + \frac{1}{2}\sqrt{3}\dfrac{W_{\eta_\omega}^\ddagger + W_{S_\omega}^\dagger}{\eta_\omega + S_\omega} + \\ \frac{1}{2}\sqrt{2}\dfrac{U_{S_u}^\ddagger - U_{\eta_u}^\dagger}{\eta_u + S_u} - \frac{1}{4}\sqrt{2}\dfrac{V_{S_v}^\ddagger - V_{\eta_v}^\dagger}{\eta_v + S_v} - \\ \frac{1}{4}\sqrt{2}\dfrac{W_{S_\omega}^\ddagger - W_{\eta_\omega}^\dagger}{\eta_\omega + S_\omega} \\ \dfrac{U_{\eta_u}^\ddagger + U_{S_u}^\dagger}{\eta_u + S_u} + \frac{1}{4}\sqrt{6}\dfrac{V_{S_v}^\ddagger - V_{\eta_v}^\dagger}{\eta_v + S_v} - \\ \frac{1}{4}\sqrt{6}\dfrac{W_{S_\omega}^\ddagger - W_{\eta_\omega}^\dagger}{\eta_\omega + S_\omega} - \frac{1}{2}\dfrac{V_{\eta_v}^\ddagger + V_{S_v}^\dagger}{\eta_v + S_v} - \\ \frac{1}{2}\dfrac{W_{\eta_\omega}^\ddagger + W_{S_\omega}^\dagger}{\eta_\omega + S_\omega} \\ \frac{1}{2}\sqrt{2}\left(\dfrac{U_{S_u}^\ddagger - U_{\eta_u}^\dagger}{\eta_u + S_u} + \dfrac{V_{S_v}^\ddagger - V_{\eta_v}^\dagger}{\eta_v + S_v} + \dfrac{W_{S_\omega}^\ddagger - W_{\eta_\omega}^\dagger}{\eta_\omega + S_\omega}\right) \end{pmatrix} \quad (106)$$

We bring the final forms of the solutions here for convenience $$B_1 = \frac{2\sqrt{2}}{9}\dfrac{U_{S_u}^\ddagger - U_{\eta_u}^\dagger}{\eta_u + S_u} - \frac{\sqrt{2}}{9}\dfrac{V_{S_v}^\ddagger - V_{\eta_v}^\dagger}{\eta_v + S_v} - \frac{2\sqrt{3}}{9}\dfrac{(V_{\eta_v}^\ddagger + V_{S_v}^\dagger)}{\eta_v + S_v} - \\ \frac{\sqrt{2}}{9}\dfrac{W_{S_\omega}^\ddagger - W_{\eta_\omega}^\dagger}{\eta_\omega + S_\omega} + \frac{2\sqrt{3}}{9}\dfrac{(W_{\eta_\omega}^\ddagger + W_{S_\omega}^\dagger)}{\eta_\omega + S_\omega} \quad (107)$$

$$B = \frac{4}{9}\dfrac{U_{\eta_u}^\ddagger + U_{S_u}^\dagger}{\eta_u + S_u} + \frac{\sqrt{6}}{9}\dfrac{V_{S_v}^\ddagger - V_{\eta_v}^\dagger}{\eta_v + S_v} - \frac{2}{9}\dfrac{V_{\eta_v}^\ddagger + V_{S_v}^\dagger}{\eta_v + S_v} - \\ \frac{\sqrt{6}}{9}\dfrac{W_{S_\omega}^\ddagger - W_{\eta_\omega}^\dagger}{\eta_\omega + S_\omega} - \frac{2}{9}\dfrac{W_{\eta_\omega}^\ddagger + W_{S_\omega}^\dagger}{\eta_\omega + S_\omega} \quad (108)$$

$$B_3 = -\frac{\sqrt{2}}{3}\left(\dfrac{U_{S_u}^\ddagger - U_{\eta_u}^\dagger}{\eta_u + S_u} + \dfrac{V_{S_v}^\ddagger - V_{\eta_v}^\dagger}{\eta_v + S_v} + \dfrac{W_{S_\omega}^\ddagger - W_{\eta_\omega}^\dagger}{\eta_\omega + S_\omega}\right) \quad (109)$$

where $$U^\dagger \triangleq \frac{U_1 + U_3 - U_5 - U_7}{2} - \frac{U_0 + U - U_4 - U_6}{2\sqrt{2}} + \\ L_u g_{13}' \eta_u - g_3' v_u - L_u g_3' S_u$$

$$U^\ddagger \triangleq \frac{U_1 - U_3 - U_5 + U_7}{2} - \frac{U_0 - U - U_4 - U_6}{2\sqrt{2}} - \\ g_{13}' v_u - L_u g_3' \eta_u - L_u g_{13}' S_u$$

$$V^\dagger \triangleq \frac{V_1 + V_3 - V_5 - V_7}{2} - \frac{V_0 + V - V_4 - V_6}{2\sqrt{2}} + \\ L_v g_{13}'' \eta_v - g_3'' v_v - L_u g_3'' S_v$$

$$V^\ddagger \triangleq \frac{V_1 - V_3 - V_5 + V_7}{2} - \frac{V_0 - V - V_4 + V_6}{2\sqrt{2}} - \\ g_{13}'' v_v - L_v g_3'' \eta_v - L_v g_3'' S_v$$

$$W^\dagger \triangleq \frac{W_1 + W_3 - W_5 - W_7}{2} - \frac{W_0 + W - W_4 - W_6}{2\sqrt{2}} + \\ L_\omega g_{13}''' \eta_\omega - g_3''' v_\omega - L_\omega g_3''' S_\omega$$

$$W^\ddagger \triangleq \frac{W_1 - W_3 - W_5 + W_7}{2} - \frac{W_0 - W - W_4 + W_6}{2\sqrt{2}} - \\ g_{13}''' v_v - L_\omega g_3''' \eta_u - L_\omega g_{13}''' S_u$$

-continued $$g'_{13} = {}^1g_{11} - {}^1g_{33},$$

$$g''_3 = -\frac{1}{4}\sqrt{2}\,g_1 - \frac{1}{4}\sqrt{2}\,g_3 + \frac{1}{8}\sqrt{6}\,g_{11} - \frac{1}{4}\sqrt{6}\,g_{13} - \frac{1}{8}\sqrt{6}\,g$$

$$g'_3 = {}^1\sqrt{2}\,(g_1 + g_3),$$

$$g'''_{13} = \frac{1}{8}g_{11} + \frac{3}{8}g - {}^1g_{33} + \frac{1}{4}\sqrt{3}\,g_1$$

$$g''_{13} = \frac{1}{8}g_{11} + \frac{3}{8}g - {}^1g_{33} - \frac{1}{4}\sqrt{3}\,g_1, \quad g'''_3 = -\frac{1}{4}\sqrt{2}\,g_1 - \frac{1}{4}\sqrt{2}\,g_3 - \frac{1}{8}\sqrt{6}\,g_{11} + \frac{1}{4}\sqrt{6}\,g_{13} + \frac{1}{8}\sqrt{6}\,g$$

Formally the scolding coefficients, $v_u$, $\varsigma_u$ and $\eta_u$ are defined by equations 55 and 70 but would normally be determined by calibration.

V. EXAMPLES

A. Precession About the z-Axis.

Say $\sigma_1 = \sigma = 0$, $S_1 = S = S$. If the gradiometer precesses about the the axis of rotation by virtue of an error angle of $\phi$ say, then the theory developed above suffices to model this by letting, $\tau_1 = -\tau = \phi$. [1]. Using equations ??

$$\left.\begin{array}{l} \xi_u \triangleq \rho Q S \cos\phi \\ \chi_u \triangleq 0 \\ v_u \triangleq 2\rho Q S \sin\phi \\ \varsigma_u \triangleq 0 \\ \eta_u \triangleq 0 \end{array}\right\} \quad \begin{array}{l} \alpha_u \triangleq (2QS\rho\cos\phi)^{-1} \\ \beta_u \triangleq (0)^{-1} \\ U^\dagger \triangleq U_0 - U + U_4 - U_6 \\ U^\ddagger \triangleq U_1 - U_3 + U_5 - U_7 \\ M_1 \triangleq S\cos\phi, N_1 \triangleq S\sin\phi \\ M \triangleq S\cos\phi, N \triangleq -S\sin\phi \end{array} \quad (110)$$

VI. Appendix 1: Geographic Coordinate System, $C_G$.

The geographical coordinates system, $C_G$, is defined as follows:

$x_G$-axis: The $x_G$-axis is along the traverse in the direction of increasing station number ("grid north").

$y_G$-axis: The $y_G$-axis is at 90° to the $x_G$-axis, parallel to the ground and points right as you look along the traverse ("grid east").

$z_G$-axis: The $z_G$-axis is vertically down (pointing at the centre of mass of the earth).

This is a right-handed Cartesian coordinate system in terms of which a unit vector with azimuth. A (the angle measured clockwise from grid north) and inclination I (angle measured positive downward from the horizontal) is unit vector with azimuth $A$ and inclination $I$=(cos $A$ cos $I$, sin $A$ cos $I$, sin $I$). (111)

1. Transformations Between C and $C_G$.

The transformation between C and $C_G$ assumes a particularly simple form if the instrument is oriented with its base horizontal and its x-axis aligned due north. In this case C is mapped to $C_G$ by a positive rotation through an angle $\pi$ radians about the x-axis and the transformations of the field and tensor and data become simply $$B_G = \hat{R}_\pi B \quad (112)$$

$$\hat{g}_G = \hat{R}_\pi \hat{g} \hat{R}_\pi^{-1} \quad (113)$$

where $$\hat{R}_\pi = \hat{R}_\pi^{-1} = \begin{pmatrix} 1 & 0 & 0 \\ 0 & -1 & 0 \\ 0 & 0 & -1 \end{pmatrix} \quad (114)$$

Hence $$\begin{pmatrix} B_{G1} \\ B_G \\ B_{G3} \end{pmatrix} = \begin{pmatrix} B_1 \\ -B \\ -B_3 \end{pmatrix} \quad (115)$$

and $$\begin{pmatrix} g_{G11} & g_{G1} & g_{G13} \\ g_{G1} & g_G & g_{G3} \\ g_{G31} & g_{G3} & g_{G33} \end{pmatrix} = \begin{pmatrix} g_{11} & -g_1 & -g_{13} \\ -g_1 & g & g_3 \\ -g_{31} & g_3 & g_{33} \end{pmatrix} \quad (116)$$

More generally if the instrument has azimuth A and inclination I (in geographic coordinates) then C is mapped to $C_G$ by first rotating about y through an angle of $-I$ then by a rotation about the resulting z through an angle A followed lastly by a rotation about the resulting x of $\pi$. Hence $$B_G = \hat{R}_x(\pi)\,\hat{R}_z(A)\,\hat{R}_y(-I)\,B \quad (117)$$

$$\begin{pmatrix} B_{G1} \\ B_G \\ B_{G3} \end{pmatrix} = \begin{pmatrix} 1 & 0 & 0 \\ 0 & \cos\pi & \sin\pi \\ 0 & -\sin\pi & \cos\pi \end{pmatrix} \begin{pmatrix} \cos A & \sin A & 0 \\ -\sin A & \cos A & 0 \\ 0 & 0 & 1 \end{pmatrix} \quad (118)$$

$$\begin{pmatrix} \cos(-I) & 0 & -\sin(-I) \\ 0 & 1 & 0 \\ \sin(-I) & 0 & \cos(-I) \end{pmatrix} \begin{pmatrix} B_1 \\ B \\ B_3 \end{pmatrix}$$

$$= \begin{pmatrix} \cos A\cos I & \sin A & \cos A\sin I \\ \sin A\cos I & -\cos A & \sin A\sin I \\ \sin I & 0 & -\cos I \end{pmatrix} \begin{pmatrix} B_1 \\ B \\ B_3 \end{pmatrix}$$

and $$\begin{pmatrix} g_{G11} & g_{G1} & g_{G13} \\ g_{G1} & g_G & g_{G3} \\ g_{G13} & g_{G3} & g_{G33} \end{pmatrix} = \begin{pmatrix} \cos A\cos I & \sin A & \cos A\sin I \\ \sin A\cos I & -\cos A & \sin A\sin I \\ \sin I & 0 & -\cos I \end{pmatrix}$$

$$\begin{pmatrix} g_{11} & g_1 & g_{13} \\ g_1 & g & g_3 \\ g_{13} & g_3 & g_{33} \end{pmatrix}$$

$$\begin{pmatrix} \cos A\cos I & \sin A\cos I & \sin I \\ \sin A & -\cos A & 0 \\ \cos A\sin I & \sin A\sin I & -\cos I \end{pmatrix}$$

In the special case $A=I=0$ we get so that $$\begin{pmatrix} B_{G1} \\ B_G \\ B_{G3} \end{pmatrix} = \begin{pmatrix} B_1 \\ -B \\ -B_3 \end{pmatrix}$$

-continued $$\begin{pmatrix} g_{G11} & g_{G1} & g_{G13} \\ g_{G1} & g_G & g_{G3} \\ g_{G13} & g_{G3} & g_{G33} \end{pmatrix} = \begin{pmatrix} g_{11} & -g_1 & -g_{13} \\ -g_1 & g & g_3 \\ -g_{13} & g_3 & g_{33} \end{pmatrix}$$

as above.

The approximation used in obtaining equation (3) above, which is significantly simplified as compared to equation (2), involves truncating the Taylor series expansion of the magnetic field as a function of position to include the effects of the B-field and the first-order gradients only. This simplifying approximation is desirable because the Taylor series expansion has an infinite number of terms. The approximation is justified because the magnitudes of the higher-order terms decreases as the order of the terms increases, for three reasons. The higher-order terms in the Taylor series are scaled by prefactors which may be written as the product of two factors. Firstly, one of these factors is a scaling term which decreases with increasing order. The second factor is proportional to $1/r^n$, where r is half the distance of separation between the field detectors, and n is the order of the term. Since the separation between the field sensors is small, raising this to an increasing power rapidly decreases the magnitude of this factor. The third reason the approximation is justified is that higher-order gradients fall off faster with distance from the field source than lower-order gradients, so the signal at the gradiometer is dominated by the field and the first-order gradient components.

The effects of misalignments of the field detectors on the output voltages from the instrument are also scaled by these higher-order terms, but these effects are small and similarly decrease with increasing order.

Referring to equations (6)-(8), it is noted that the value of λ may be any value in the range of 0° to 90°, inclusive. As noted in equation (9), when λ is approximately 35.3°, an orthogonal system is provided. In the presently described embodiment, λ is 45°.

It will be appreciated by persons skilled in the art that numerous variations and/or modifications may be made to the invention as shown in the specific embodiments without departing from the spirit or scope of the invention as broadly described. In particular, the present invention may be applied in conjunction with the invention set out in the co-pending PCT application claiming priority from Australian Provisional Patent Application No. 2002950624 and filed simultaneously with the present application, the contents of which are herein incorporated by reference. The present embodiments are, therefore, to be considered in all respects as illustrative and not restrictive.

The invention claimed is:

1. A method of electromagnetic field detection comprising:
   providing three electromagnetic axial gradiometers in an electromagnetic field, each electromagnetic gradiometer having at least first and second electromagnetic field vector sensors connected in a differencing arrangement; and
   angularly displacing each electromagnetic gradiometer about a respective axis relative to the electromagnetic field during operation of the electromagnetic gradiometer, wherein the respective axis of each gradiometer is not parallel to a respective axis of any other of the gradiometers; and
   determining from output signals of the three electromagnetic gradiometers components of a gradient tensor of the electromagnetic field and components of the electromagnetic field.

2. The method of claim 1 wherein angularly displacing each gradiometer is performed by rotating the gradiometer continuously during operation of the gradiometer.

3. The method of claim 1 wherein angularly displacing each gradiometer is performed by rotating the gradiometer piecewise about the respective axis.

4. The method of claim 1, wherein the respective axis of rotation of each axial gradiometer is positioned substantially perpendicular to the axial alignment of the first and second field vector sensors, substantially between the first and second field vector sensors, and substantially equidistant from the first and second field vector sensors.

5. The method of claim 1 wherein the field vector sensors of the axial magnetic gradiometer are one of: SQUIDs, flux gates and superconducting pick up-loops.

6. The method of claim 5 wherein the sensitivity vectors of the field vector sensors lie substantially in a nominal x-y plane, and wherein the axial magnetic gradiometer is rotated about a nominal z-axis perpendicular to the x-y plane.

7. An electromagnetic field detection device comprising:
   three electromagnetic axial gradiometers, each gradiometer having at least first and second field vector sensors connected in a differencing arrangement; and
   means for angularly displacing each electromagnetic gradiometer about a respective axis relative to an electromagnetic field during operation of the electromagnetic gradiometer, the respective axes being non-parallel; and
   processing means for determining from output signals of the three electromagnetic gradiometers components of a gradient tensor of the electromagnetic field and components of the electromagnetic field.

8. The device of claim 7 wherein the means for angularly displacing each electromagnetic gradiometer is operable to rotate each gradiometer continuously during operation of the gradiometer.

9. The device of claim 7, wherein the means for angularly displacing each electromagnetic gradiometer is operable to rotate each gradiometer piecewise about the axis of rotation.

10. The device of claim 7, wherein the respective axis of rotation of each axial gradiometer is positioned substantially perpendicular to the co-axial first and second field vectors, substantially between the first and second field vector sensors, and substantially equidistant from the first and second field vector sensors.

11. The device of claim 7, wherein the field vector sensors of the axial magnetic gradiometer are one of: SQUIDs, flux gates and superconducting pick up-loops.

12. The device of claim 11 wherein the sensitivity vectors of the field vector sensors of each gradiometer lie substantially in a nominal x-y plane, and wherein the means for angularly displacing each electromagnetic gradiometer comprises means for rotating the at least first and second field vector sensors about a nominal z-axis perpendicular to the x-y plane.

13. The method of claim 1 further comprising distinguishing field gradient information from field information in the Fourier domain.

14. The method of claim 1 further comprising distinguishing information about the $g_{xy}$ component of the gradient tensor from information due to the diagonal gradient components, even at the same frequency.

15. The method of claim 1 wherein DC offsets are determined and monitored to provide information about the operating conditions of the gradiometers, and wherein the DC offsets comprise one or both of: low frequency drift in at least one field vector sensor of the at least three gradiometers; and the fixed offset of at least one field vector sensor of the at least three gradiometers.

16. The method of claim 1 wherein the at least three gradiometers are rotated at differing frequencies, in order to facilitate separation of their data signals in the Fourier domain.

17. The device of claim 7 wherein the at least three gradiometers are rotated at differing frequencies, in order to facilitate separation of their data signals in the Fourier domain.

18. The device of claim 7 further comprising means for detecting and measuring a DC offset, wherein the DC offset comprises one or both of: low frequency drift in at least one field vector sensor of the at least three gradiometers; and the fixed offset of at least one field vector sensor of the at least three gradiometers.

19. The device of claim 7 further comprising means for distinguishing field gradient information from field information in the Fourier domain.

* * * * *